US011335759B2

(12) United States Patent
 Baek et al.

(10) Patent No.: US 11,335,759 B2
(45) Date of Patent: May 17, 2022

(54) DISPLAY DEVICE

(71) Applicant: SAMSUNG DISPLAY CO., LTD., Yongin-si (KR)

(72) Inventors: Gyungmin Baek, Yongin-si (KR); Hongsick Park, Yongin-si (KR); Juhyun Lee, Yongin-si (KR); Jaeuoon Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 144 days.

(21) Appl. No.: 16/806,437

(22) Filed: Mar. 2, 2020

(65) Prior Publication Data

US 2020/0395428 A1    Dec. 17, 2020

(30) Foreign Application Priority Data

Jun. 13, 2019 (KR) .......................... 10-2019-0070068

(51) Int. Cl.
 *H01L 27/32* (2006.01)
 *H01L 27/12* (2006.01)
(52) U.S. Cl.
 CPC ........ *H01L 27/3276* (2013.01); *H01L 27/124* (2013.01)
(58) Field of Classification Search
 CPC ............... H01L 27/124; H01L 27/3246; H01L 27/3276
 See application file for complete search history.

(56) References Cited

U.S. PATENT DOCUMENTS

| 8,946,008 B2 | 2/2015 | Ahn |
| 2013/0001564 A1 | 1/2013 | Choi et al. |
| 2014/0346458 A1* | 11/2014 | Park .................. H01L 27/3276 257/40 |
| 2018/0061895 A1 | 3/2018 | Kim et al. |
| 2018/0075805 A1 | 3/2018 | Kim et al. |

FOREIGN PATENT DOCUMENTS

| EP | 3331046 A1 | 6/2018 |
| KR | 1020140056565 A | 5/2014 |
| KR | 1020160035200 A | 3/2016 |
| KR | 1020160079978 A | 7/2016 |
| KR | 1020170078168 A | 7/2017 |

OTHER PUBLICATIONS

Extended European Search Report for Application No. 20165096.7 dated Jul. 16, 2020.

* cited by examiner

*Primary Examiner* — Daniel P Shook
(74) *Attorney, Agent, or Firm* — Cantor Colburn LLP

(57) ABSTRACT

A display device includes: a substrate including a display area and a peripheral area outside the display area; a plurality of display elements arranged in the display area; and a pad disposed in the peripheral area and having a multi-layered structure, where the multi-layered structure of the pad includes: a metal layer; a conductive protective layer on a top surface of the metal layer; and a metal thin film on a top surface of the conductive protective layer.

19 Claims, 30 Drawing Sheets

DISPLAY DEVICE

This application claims priority to Korean Patent Application No. 10-2019-0070068, filed on Jun. 13, 2019, and all the benefits accruing therefrom under 35 U.S.C. § 119, the content of which in its entirety is herein incorporated by reference.

BACKGROUND

1. Field

One or more embodiments relate to a display device.

2. Description of Related Art

A display device is an apparatus that receives information about an image and displays the image. In the display device, pads may be arranged at an edge of the display device to receive information for an image, etc., and the pads may be electrically connected to display elements. The pads may be electrically connected to pads of a printed circuit board or bumps of an integrated circuit.

SUMMARY

During a process of manufacturing a display device, a portion of each pad of the display device may be exposed to be electrically connected to a pad of a printed circuit board or bumps of an integrated circuit. Exposed pads may be corroded, and an electric resistance of the corroded pads may be reduced.

One or more embodiments relate to a display device including pads manufacture with reduced number of processes without reducing an electrical characteristics thereof. However, it should be understood that embodiments described herein should be considered in a descriptive sense only and not for limitation of the disclosure.

According to an embodiment, a display device includes: a substrate including a display area and a peripheral area outside the display area; a plurality of display elements arranged in the display area; and a pad in the peripheral area and having a multi-layered structure, where the multi-layered structure of the pad includes: a metal layer; a conductive protective layer arranged on a top surface of the metal layer; and a metal thin film on a top surface of the conductive protective layer.

In an embodiment, the conductive protective layer may include a transparent conductive oxide.

In an embodiment, a lateral surface of the multi-layered structure may have a forward-tapered inclination.

In an embodiment, each of the metal layer and the metal thin film may include at least one of Al, Pt, Pd, Ag, Mg, Au, Ni, Nd, Ir, Cr, Li, Ca, Mo, or Cu.

In an embodiment, a thickness of the metal layer may be greater than a thickness of the conductive protective layer, and the thickness of the metal layer may be greater than a thickness of the metal thin film.

In an embodiment, a thickness of the metal thin film may be about 300 angstrom (Å) or less.

In an embodiment, the metal thin film may include: a metal sub-layer including a metal element; and a metal oxide sub-layer on the metal sub-layer and including an oxide of the metal element of the metal sub-layer.

In an embodiment, the display device may further include: an insulating layer covering an edge of the multi-layered structure of the pad, where a hole may be defined through the insulating layer to overlap the multi-layered structure of the pad.

In an embodiment, the insulating layer may further include: an inorganic insulating layer, through which a first hole is defined to overlap the multi-layered structure of the pad; and an organic insulating layer, through which a second hole is defined to overlap the multi-layered structure of the pad and the first hole.

In an embodiment, a third hole may be defined through the metal thin film of the multi-layered structure to overlap the hole of the insulating layer.

In an embodiment, the metal thin film may include: a metal sub-layer including a metal element; and a metal oxide sub-layer on a top surface of the metal sub-layer and including an oxide of the metal element of the metal sub-layer.

In an embodiment, the multi-layered structure of the pad may further include: a bottom metal layer on a bottom surface of the metal layer.

According to an embodiment, a display device includes: a substrate including a display area and a peripheral area outside the display area; a display element arranged in the display area; a pixel circuit including a thin film transistor and a storage capacitor, where the thin film transistor and the storage capacitor are electrically connected to the display element; and a pad located in the peripheral area and having a forward-tapered lateral surface, where the pad has a multi-layered structure, and the multi-layered structure of the pad includes a conductive layer including: a transparent conductive oxide; and a metal thin film on a top surface of the conductive layer.

In an embodiment, the metal thin film may include at least one of Al, Pt, Pd, Ag, Mg, Au, Ni, Nd, Ir, Cr, Li, Ca, Mo, or Cu.

In an embodiment, the metal thin film may include: a metal sub-layer including a metal element; and a metal oxide sub-layer on a top surface of the metal sub-layer and including an oxide of the metal element of the metal sub-layer.

In an embodiment, the display device may further include: an insulating layer covering an edge of the pad, and a hole may be defined through the insulating layer to overlap the multi-layered structure of the pad.

In an embodiment, a hole may be defined through the metal thin film of the multi-layered structure to correspond to the hole of the insulating layer.

In an embodiment, at least one of an electrode of the thin film transistor or an electrode of the storage capacitor may include a same number of sub-layers as the multi-layered structure of the pad.

In an embodiment, the multi-layered structure of the pad may include a metal layer on a bottom surface of the conductive layer and having a thickness equal to or greater than about ½ a thickness of the pad.

In an embodiment, the display device may further include: a bottom conductive layer on a bottom surface of the conductive layer, where the metal layer may include at least one of Al, Pt, Pd, Ag, Mg, Au, Ni, Nd, Ir, Cr, Li, Ca, Mo, or Cu, and the bottom conductive layer may include a metal element different from that of the metal layer.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
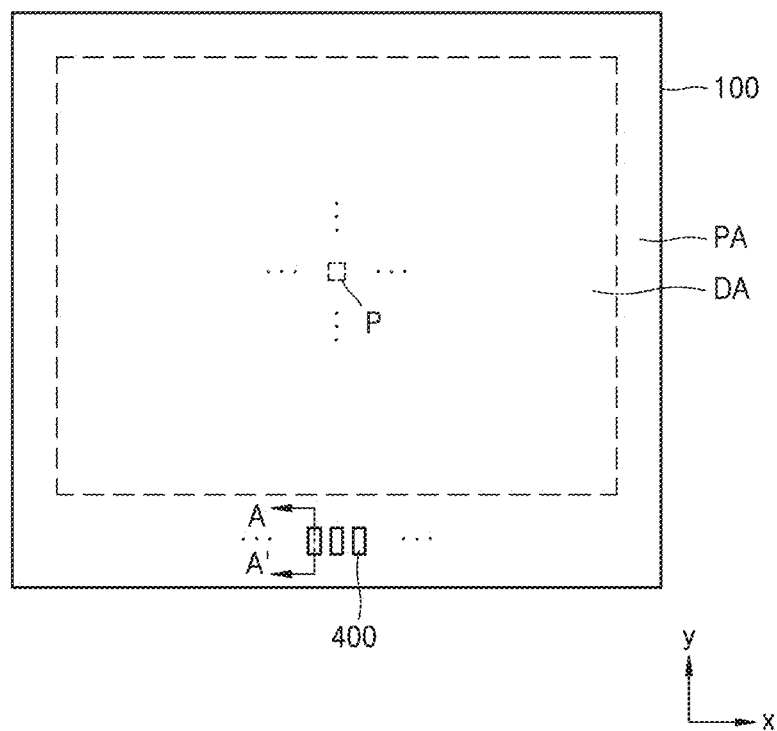
FIG. 1 is a plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. As used herein, the phrase "at least one of" modifying listed items includes any and all combinations of one or more of the listed items. For example, the expression "at least one of a, b or c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that the terms "comprises/includes" and/or "comprising/including" used herein specify the presence of stated features or components, but do not preclude the presence or addition of one or more other features or components.

It will also be understood that when a layer is referred to as being "on" another layer or substrate, it can be directly on the other layer or substrate, or intervening layers may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Sizes of elements in the drawings may be exaggerated for convenience of explanation. In other words, since sizes and thicknesses of components in the drawings are arbitrarily illustrated for convenience of explanation, the following embodiments are not limited thereto.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Herein, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the invention will be described in detail with reference to the accompanying drawings.

Figure 2:
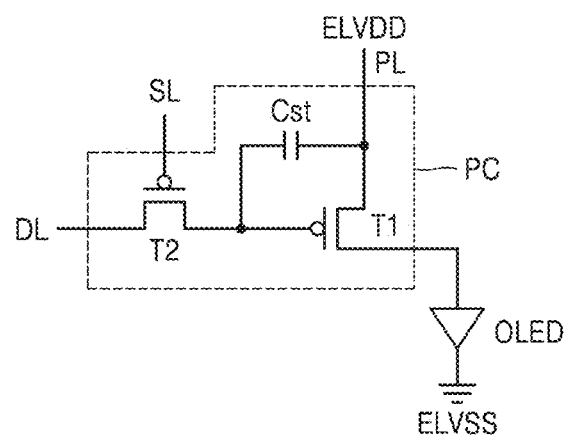
FIG. 2 is an equivalent circuit diagram of one of pixels in a display device according to an embodiment.

FIG. 1 is a plan view of a display device according to an embodiment, and FIG. 2 is an equivalent circuit diagram of one of the pixels in a display device according to an embodiment.

Referring to FIG. 1, an embodiment of the display device includes a substrate 100, the substrate 100 including a display area DA and a peripheral area PA. In such an embodiment, display elements are arranged in the display area DA, and the peripheral area PA, which is a non-display area and disposed outside the display area DA. The substrate 100 may include a glass material or a polymer resin. The substrate 100 including a polymer resin may have flexibility. In one embodiment, for example, a display device including the substrate 100 having flexibility may be curved, bendable, rollable or foldable, and thus a shape of the display device may be changed.

Each pixel P may include a display element that may emit light of a predetermined color, for example, an organic light-emitting diode OLED as shown in FIG. 2. The organic light-emitting diode OLED may emit, for example, red, green, or blue light or emit red, green, blue, or white light. Each organic light-emitting diode OLED may be electrically connected to a pixel circuit PC.

In an embodiment, as shown in FIG. 2, the pixel circuit PC may include a first thin film transistor T1, a second thin film transistor T2, and a storage capacitor Cst. The second thin film transistor T2 may be a switching thin film transistor and connected to a scan line SL and a data line DL. The second thin film transistor T2 transfers a data voltage input through the data line DL to the first thin film transistor T1 in response to a switching voltage input through the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied through the driving voltage line PL.

The first thin film transistor T1 may be a driving thin film transistor, be connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness corresponding to the driving current. An opposite electrode (e.g. a cathode) of the organic light-emitting diode OLED may receive a second power voltage ELVSS.

In an embodiment, as in FIG. 2, the pixel circuit PC includes two thin film transistors and one storage capacitor, but not being limited thereto. In an alternative embodiment, the number of the thin film transistors and the number of the storage capacitors may be variously changed depending on a design of the pixel circuit PC.

Referring back to FIG. 1, a plurality of pads 400 are arranged in the peripheral area PA of the substrate 100. Though FIG. 1 shows an embodiment including three pads 400 for convenience of illustration and description, a greater number of pads 400 may neighbor each other and be apart from each other. Each pad 400 is an element electrically connected to a printed circuit board or an integrated circuit device and may include a conductive material.

Figure 3:
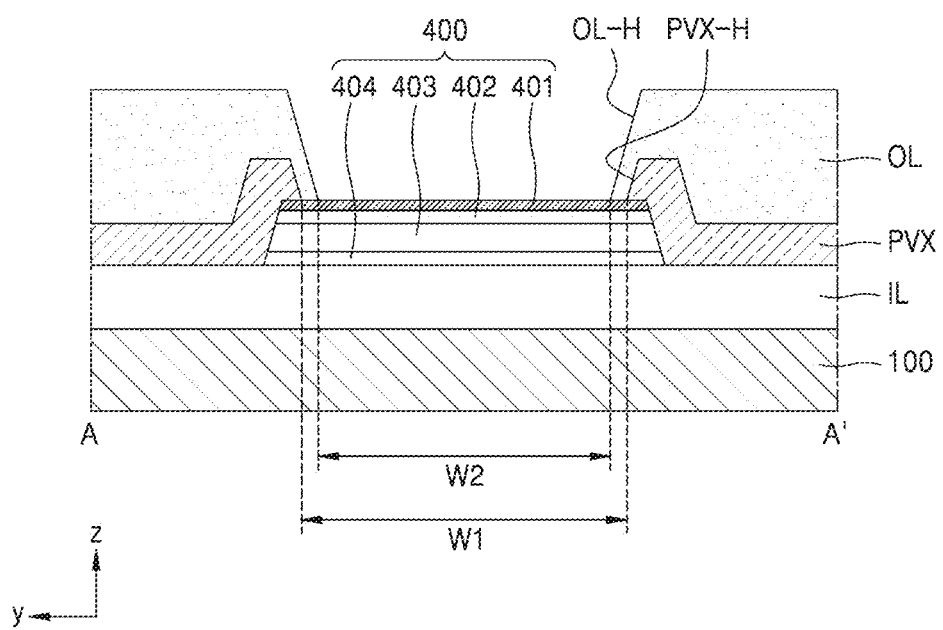
FIG. 3 is a cross-sectional view of one of pads in a display device according to an embodiment.

FIG. 3 is a cross-sectional view of one of the pads in a display device according to an embodiment. More particularly, FIG. 3 corresponds to a cross-sectional view of a pad taken along line A-A' of FIG. 1.

Referring to FIG. 3, in an embodiment, an insulating layer IL may be arranged on the substrate 100, and the pad 400 may be located on the insulating layer IL. The insulating layer IL may include at least one of an inorganic insulating layer or an organic insulating layer.

The pad 400 may have a multi-layered structure. The pad 400 may include a metal layer, a conductive protective layer, and a metal thin film that are sequentially stacked. In an embodiment, as shown in FIG. 2, the pad 400 includes a structure in which a bottom metal layer 404, a metal layer 403, a conductive protective layer 402, and a metal thin film (a metal thin layer) 401 are sequentially stacked.

The metal layer 403 may include at least one of Al, Pt, Pd, Ag, Mg, Au, Ni, Nd, Ir, Cr, Li, Ca, Mo, or Cu, there by having a predetermined conductivity. In one embodiment, for example, the metal layer 403 may include Cu. In an embodiment, the metal layer 403 may include or defined by a single Cu layer.

In an embodiment, the metal layer 403 is a layer occupying about half or greater volume of the pad 400. In such an embodiment, as shown in FIG. 3, a thickness of the metal layer 403 is about ½ or greater of a thickness of the pad 400. In one embodiment, for example, the thickness of the metal layer 403 may be about 8 to about 10 times greater than the sum of thicknesses (or the total thickness) of other sub-layers included in the pad 400, for example, the sum of the thickness of the metal thin film 401, the thickness of the conductive protective layer 402, and the thickness of the bottom metal layer 404. The thickness of the metal layer 403 may be several thousand angstrom (Å) or greater. In an embodiment, the thickness of the metal layer 403 may be in a range of about 6000 Å to about 11000 Å.

The bottom metal layer 404 may be disposed below or on a bottom surface of the metal layer 403. The bottom metal layer 404 may include at least one of Al, Pt, Pd, Ag, Mg, Au, Ni, Nd, Ir, Cr, Li, Ca, Mo, or Cu, thereby having predetermined conductivity and adhesive force. In one embodiment, for example, the bottom metal layer 404 may include a metal element different from that of the metal layer 403. In an embodiment, the bottom metal layer 404 may include or defined by a Ti layer.

A thickness of the bottom metal layer 404 is less than the thickness of the metal layer 403. The thickness of the bottom metal layer 404 may be about hundreds of Å, thereby having improved adhesive force. In one embodiment, for example, the thickness of the bottom metal layer 404 may be in a range of about 100 Å to about 400 Å, or about 200 Å to about 400 Å.

The conductive protective layer 402 may include a conductive material that may protect the metal layer 403, for example, a transparent conductive oxide ("TCO"). The TCO may include indium tin oxide ("ITO"), indium zinc oxide ("IZO"), zinc oxide (ZnO), or indium oxide ($In_2O_3$), indium gallium oxide ("IGO"), and aluminum zinc oxide ("AZO", or Al-doped ZnO). In an embodiment, the conductive protective layer 402 may include or defined by a single ITO layer.

A thickness of the conductive protective layer 402 is less than the thickness of the metal layer 403. The thickness of the conductive protective layer 402 may be about hundreds of Å. In one embodiment, for example, the thickness of the conductive protective layer 402 may be in a range of about 100 Å to about 400 Å, or about 200 Å to about 400 Å. The thickness of the conductive protective layer 402 may be substantially the same as a thickness of the bottom metal layer 404. Alternatively, the thickness of the conductive protective layer 402 may be different from the thickness of the bottom metal layer 404. In one embodiment, for example, a difference between the thickness of the conductive protective layer 402 and the thickness of the bottom metal layer 404 may be about 100 Å or less.

The metal thin film 401 may be arranged on the conductive protective layer 402 and may include a metal material. In one embodiment, for example, the metal thin film 401 may include at least one of Al, Pt, Pd, Ag, Mg, Au, Ni, Nd, Ir, Cr, Li, Ca, Mo, or Cu. The metal thin film 401 may improve an etching speed of the conductive protective layer 402 including TCO. The metal thin film 401 may contribute to a shape of a lateral surface of the conductive protective layer 402 and/or a shape of a lateral surface of the pad 400. A function or other features of the metal thin film 401 during an etching process will be described later in greater detail.

The metal thin film 401 may include a same material as that of the metal layer 403. In one embodiment, for example, the metal thin film 401 and the metal layer 403 may include the same material as each other such as Cu. Alternatively, the metal thin film 401 may include a material different from that of the metal layer 403. In one embodiment, for example, the metal layer 403 may include Cu, and the metal thin film 401 may include Mo or Ti.

The metal thin film 401 has a thickness less than that of the metal layer 403. In one embodiment, for example, the metal thin film 401 may have about 1/10 of a thickness of the metal layer 403. The thickness of the metal thin film 401 may be in a range of about several Å to several hundreds of Å, or in a range of about tens of Å to about hundreds of Å. In an embodiment, the metal thin film 401 may have a thickness of 300 Å or less. In an embodiment, the metal thin film 401 may be in a range of about 10 Å to about 300 Å, in a range of about 10 Å to about 200 Å, or in a range of about 10 Å to about 100 Å.

A lateral surface of the pad 400 having the multi-layered structure may have a forward-tapered inclination surface as shown in FIG. 3. An insulating layer is arranged on the pad 400. In an embodiment, as shown in FIG. 3, an inorganic insulating layer PVX and an organic insulating layer OL are arranged on the pad 400.

The inorganic insulating layer PVX may include an inorganic insulating material, for example, silicon oxide, silicon oxynitride, and/or silicon nitride. The inorganic insulating layer PVX may cover edges of the pad 400 and a first hole PVX-H exposing a portion of a top surface of the pad 400 is defined or formed through the organic insulating layer PVX.

The organic insulating layer OL may include an organic insulating material. The organic insulating material may include, for example, a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination (e.g., a blend) thereof.

The organic insulating layer OL may cover edges of the pad 400 and a second hole OL-H exposing a portion of the top surface of the pad 400 is defined or formed through the organic insulating layer OL. In an embodiment, a size (e.g., a width in a plan view) of the second hole OL-H may be less than a size (e.g., a width in a plan view) of the first hole PVX-H. In an embodiment, as shown in FIG. 3 that a width W2 of the second hole OL-H is less than a width W1 of the first hole PVX-H. In an alternative embodiment, the size of the second hole OL-H may be substantially the same as the size of the first hole PVX-H. In another alternative embodiment, the size of the second hole OL-H may be greater than the size of the first hole PVX-H.

In an embodiment as shown in FIG. 3, the metal thin film 401 may have a single layer structure, but embodiments of the invention are not limited thereto. In an alternative embodiment, the metal thin film 401 may have a multi-layer structure as shown in FIGS. 4A and 4B.

Figure 4A:
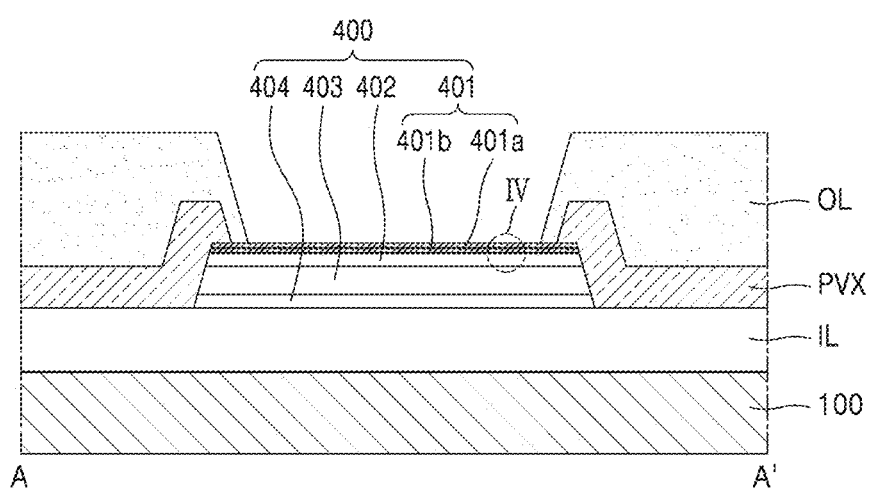
FIG. 4A is a cross-sectional view of one of pads in a display device according to an alternative embodiment.
Figure 4B:
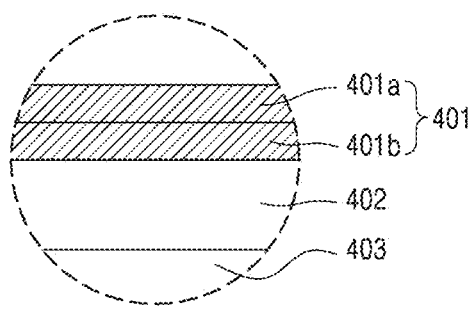
FIG. 4B is an enlarged view of the encircled portion "IV" of FIG. 4A.

FIG. 4A is a cross-sectional view of one of the pads in a display device according to an alternative embodiment, and FIG. 4B is an enlarged view of the encircled portion "IV" of FIG. 4A. It may be understood that FIG. 4A is a cross-sectional view of a pad taken along line A-A' of FIG. 1.

Referring to FIGS. 4A and 4B, the metal thin film 401 of the pad 400 includes a first sub-layer 401a that defines an uppermost surface of the metal thin film 401. The first sub-layer 401a may include an oxide metal layer including a same metal element as that of a second sub-layer 401b.

In such an embodiment, as described above with reference to FIG. 3, the pad 400 has a multi-layered structure. In one embodiment, for example, the pad 400 may include the conductive protective layer 402 and the metal thin film 401 arranged on the metal layer 403. The pad 400 may further include a bottom metal layer 404 arranged under the metal layer 403.

The metal thin film 401 arranged on an upper portion of the pad 400 having a multi-layered structure may be exposed to atmosphere including oxygen during a process of manufacturing a display device. In such an embodiment, the metal thin film 401 may include the first sub-layer 401a including a metal oxide. The first sub-layer 401a may be a metal oxide layer including a same metal element as that of the second sub-layer 401b arranged thereunder. In an embodiment, the second sub-layer 401b may include a metal layer including Cu (e.g., Cu layer), and the first sub-layer 401a may include a copper oxide layer. In an alternative embodiment, the second sub-layer 401b may include a metal such as molybdenum (e.g., Mo layer) or titanium (e.g., Ti layer), and the first sub-layer 401a may include molybdenum oxide or titanium oxide.

Since the metal thin film 401 includes the first sub-layer 401a including a metal oxide, but the metal oxide corresponds to a portion of the metal thin film 401 having a very thin thickness as described above, an influence of the metal oxide on the conductivity of the pad 400 is very trivial.

Since the features of the conductive protective layer 402, the metal layer 403 and the bottom metal layer 404 of the multi-layered structure of the pad 400 are substantially the same as those described above with reference to FIG. 3, any repetitive detailed description thereof will be omitted.

Figure 5:
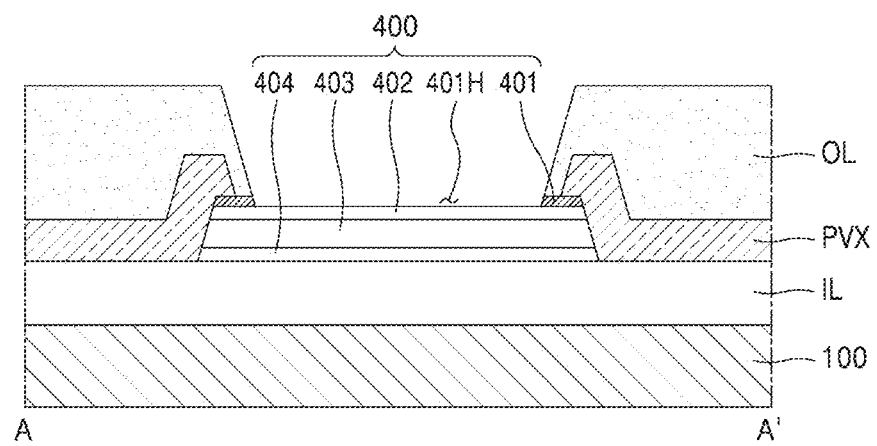
FIG. 5 is a cross-sectional view of one of pads in a display device according to another alternative embodiment.

FIG. 5 is a cross-sectional view of one of the pads in a display device according to another alternative embodiment. More particularly, FIG. 5 correspond to a cross-sectional view of a pad taken along line A-A' of FIG. 1.

Referring to FIG. 5, in an embodiment, the pad 400 has a multi-layered structure, and a third hole 401H is defined through the metal thin film 401 of the pad 400. A top surface of the conductive protective layer 402 may be exposed through the third hole 401H of the metal thin film 401.

In an embodiment, as shown in FIGS. 4A and 4B, the pad includes a portion that is not covered by the inorganic insulating layer PVX and the organic insulating layer OL. The above-described portion may be removed by being exposed to a material such as etchant during a process of manufacturing the display device. The third hole 401H of the metal thin film 401 may be formed through such a process.

The third hole 401H may be located in a central portion of the metal thin film 401. A size of the third hole 401H may be substantially the same as a size of the second hole OL-H. In an embodiment, as shown in FIG. 5, a width of the third hole 401H is substantially the same as a width of the second hole OL-H.

Since the features of the conductive protective layer 402, the metal layer 403 and the bottom metal layer 404 of the multi-layered structure of the pad 400 are substantially the same as those described above with reference to FIG. 3, any repetitive detailed description thereof will be omitted.

Figure 6A:
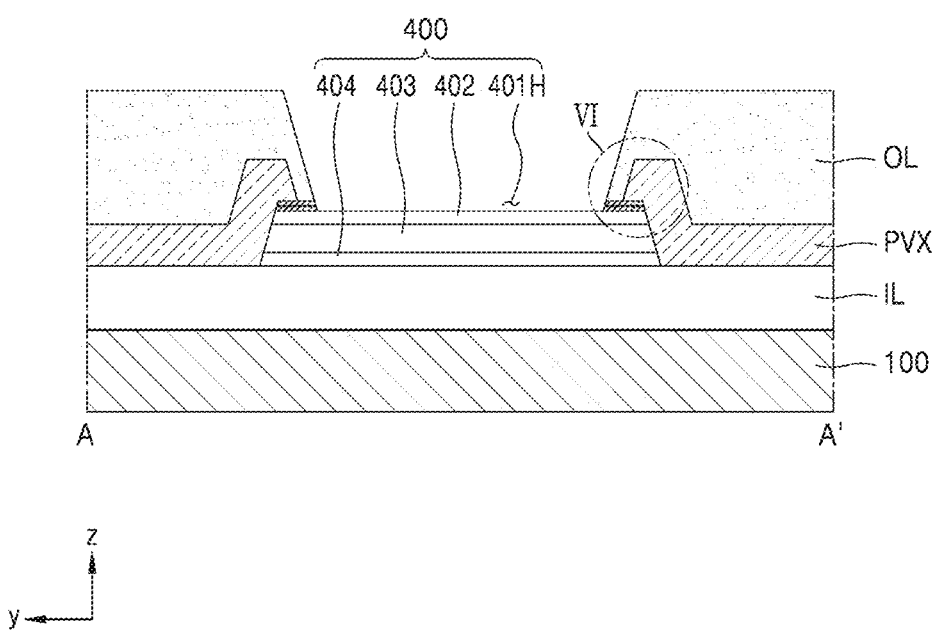
FIG. 6A is a cross-sectional view of one of pads in a display device according to another alternative embodiment.
Figure 6B:
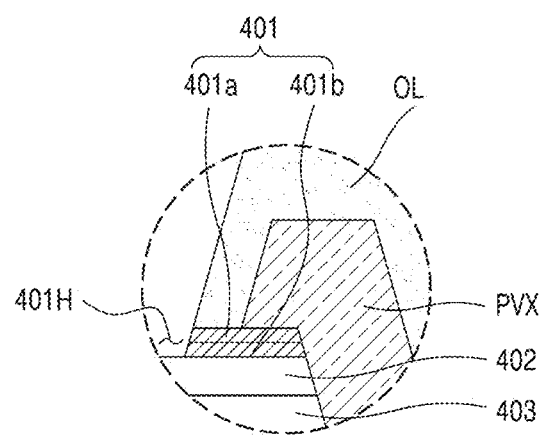
FIG. 6B is an enlarged view of the encircled portion "VI" of FIG. 6A.

FIG. 6A is a cross-sectional view of one of the pads in a display device according to another alternative embodiment, and FIG. 6B is an enlarged view of the encircled portion "VI" of FIG. 6A. More particularly, FIG. 6A corresponds to a cross-sectional view of a pad taken along line A-A' of FIG. 1.

Referring to FIGS. 6A and 6B, in an embodiment, the pad 400 may have a multi-layered structure, and the metal thin film 401 may include the first sub-layer 401a and the second sub-layer 401b as described above with reference to FIGS. 4A and 4B. The first sub-layer 401a may include a same metal element as that of the second sub-layer 401b. The first sub-layer 401a may include a metal oxide layer, and the second sub-layer 401b may include a metal layer.

In such an embodiment, the third hole 401H may be defined through the metal thin film 401 including the sub-layers. The third hole 401H may be located in a central portion of the metal thin film 401 and may defined through the first sub-layer 401a and the second sub-layer 401b. In one embodiment, for example, the third hole 401H may pass through from a top surface of the first sub-layer 401a to a bottom surface of the first sub-layer 401a, and further pass through from a top surface of the second sub-layer 401b to a bottom surface of the second sub-layer 401b. Alternatively, depending on a process (a kind of etchant, an exposing time of etchant, etc.), the third hole 401H may pass through from the top surface of the first sub-layer 401a to the bottom surface of the first sub-layer 401a, but the third hole 401H may not pass through the second sub-layer 401b.

The third hole 401H may be formed during a process of manufacturing a display device as described above with reference to FIG. 5. A size (or a width) of the third hole 401H may be substantially the same as a size (or a width) of the second hole OL-H of the organic insulating layer OL.

Embodiments of the pad 400 described above with reference to FIGS. 1 to 6B may be simultaneously formed during a process of forming a pixel P arranged in the display area DA (see FIG. 1), for example, during a process of forming a thin film transistor (also referred to as TFT in the drawings) and/or a storage capacitor Cst in a process of forming the pixel circuit PC (see FIG. 2).

Figure 7A:
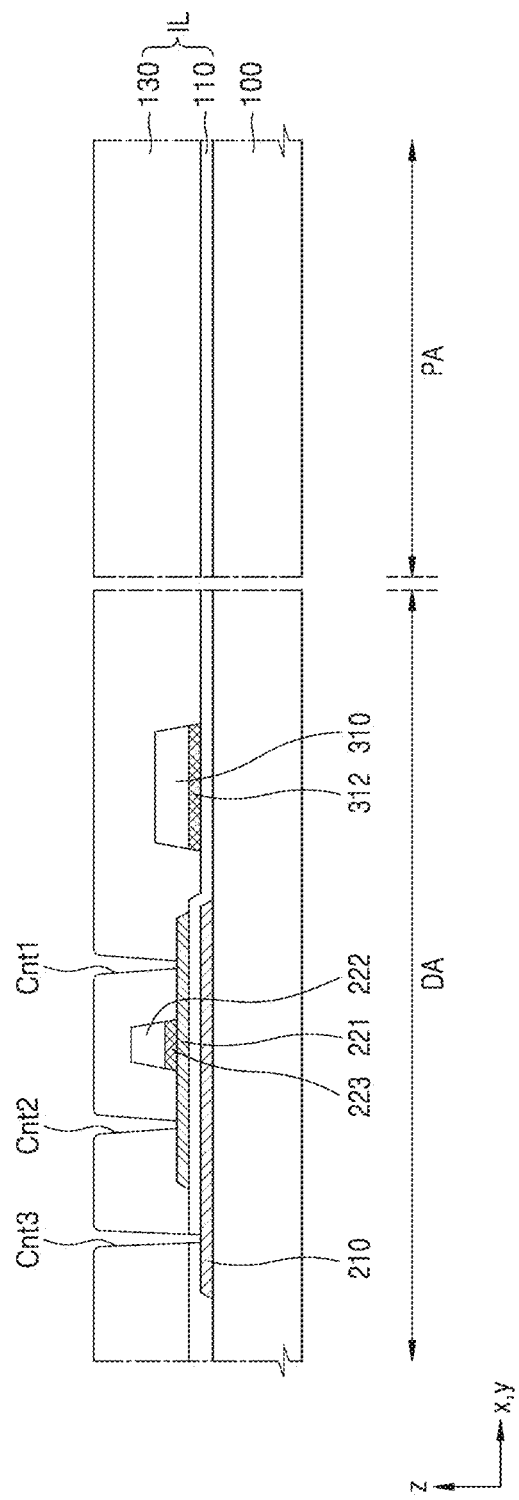
FIGS. 7A to 7G are cross-sectional views of a process of manufacturing a display device according to an embodiment.
Figure 7B:
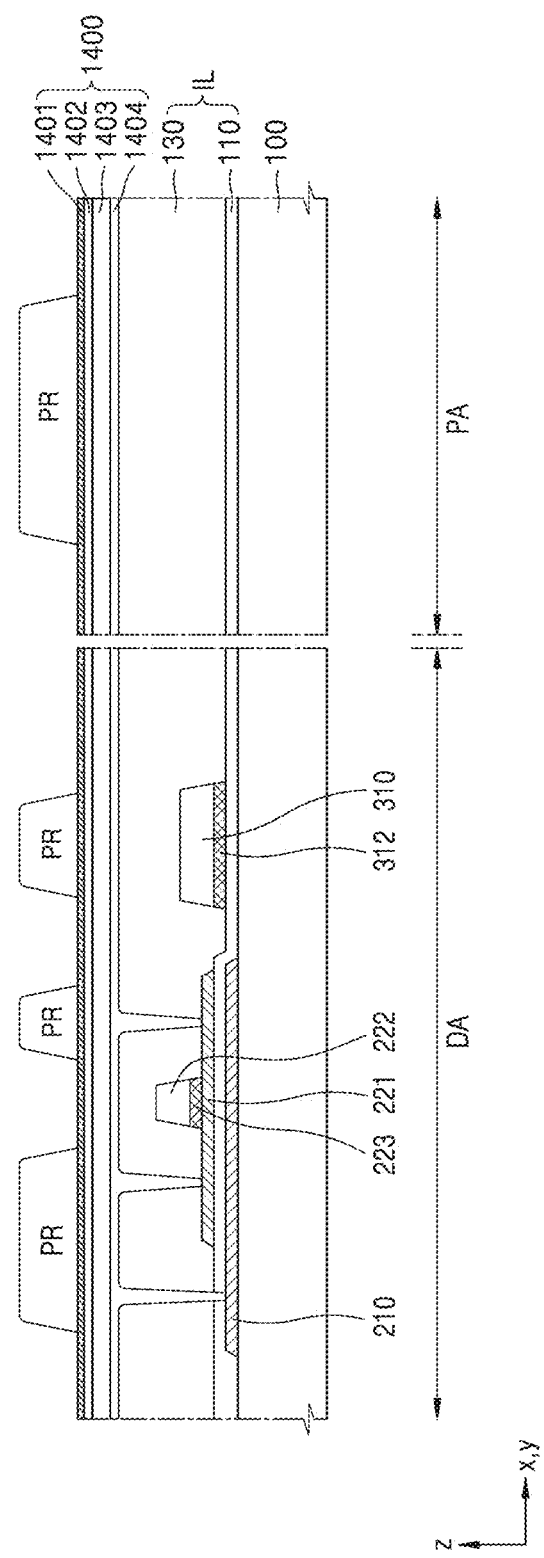
Figure 7C:
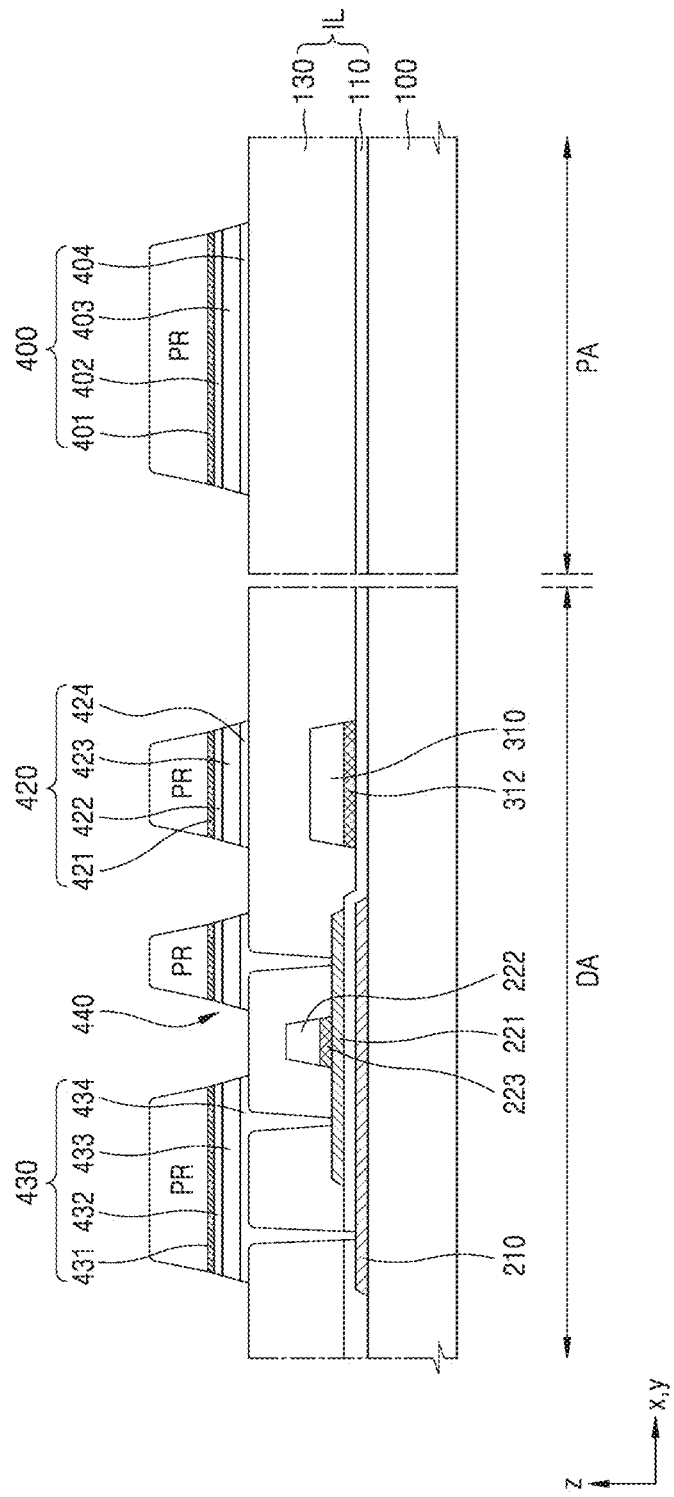
Figure 7D:
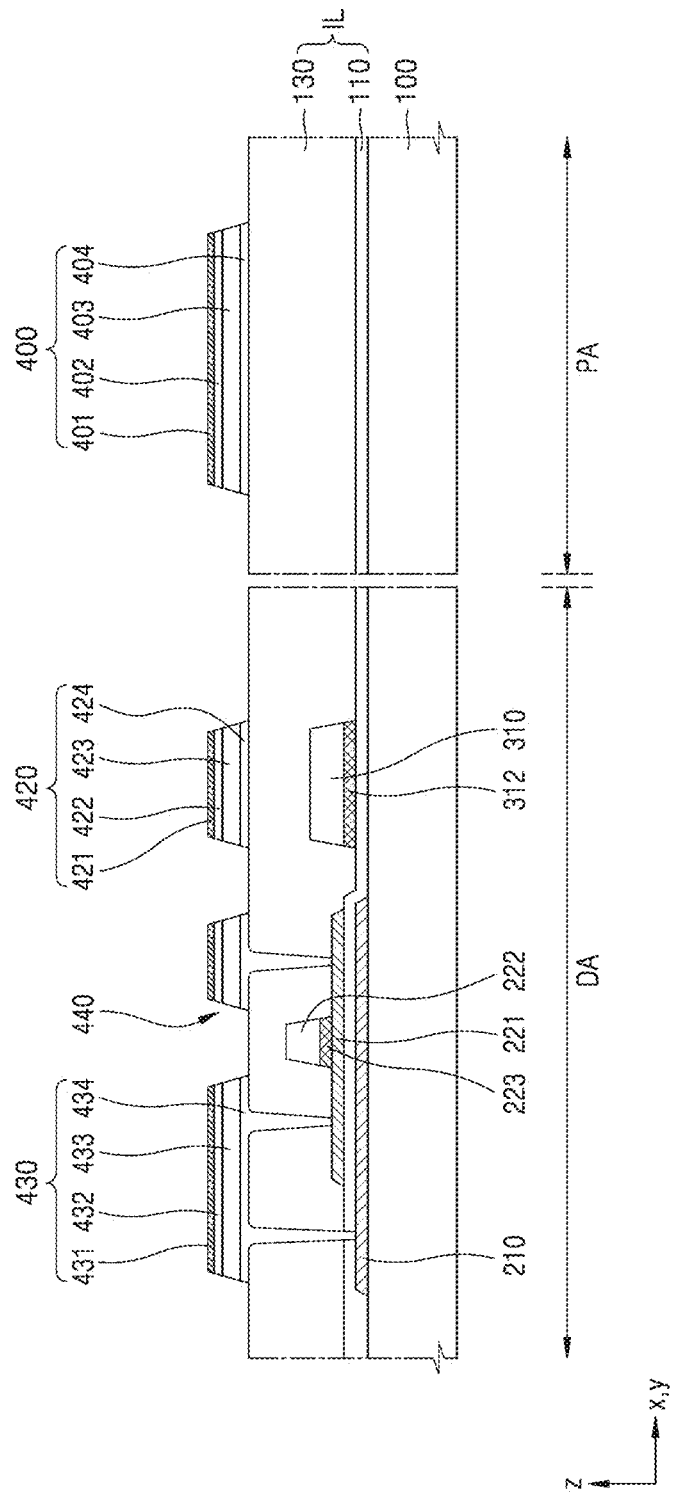
Figure 7E:
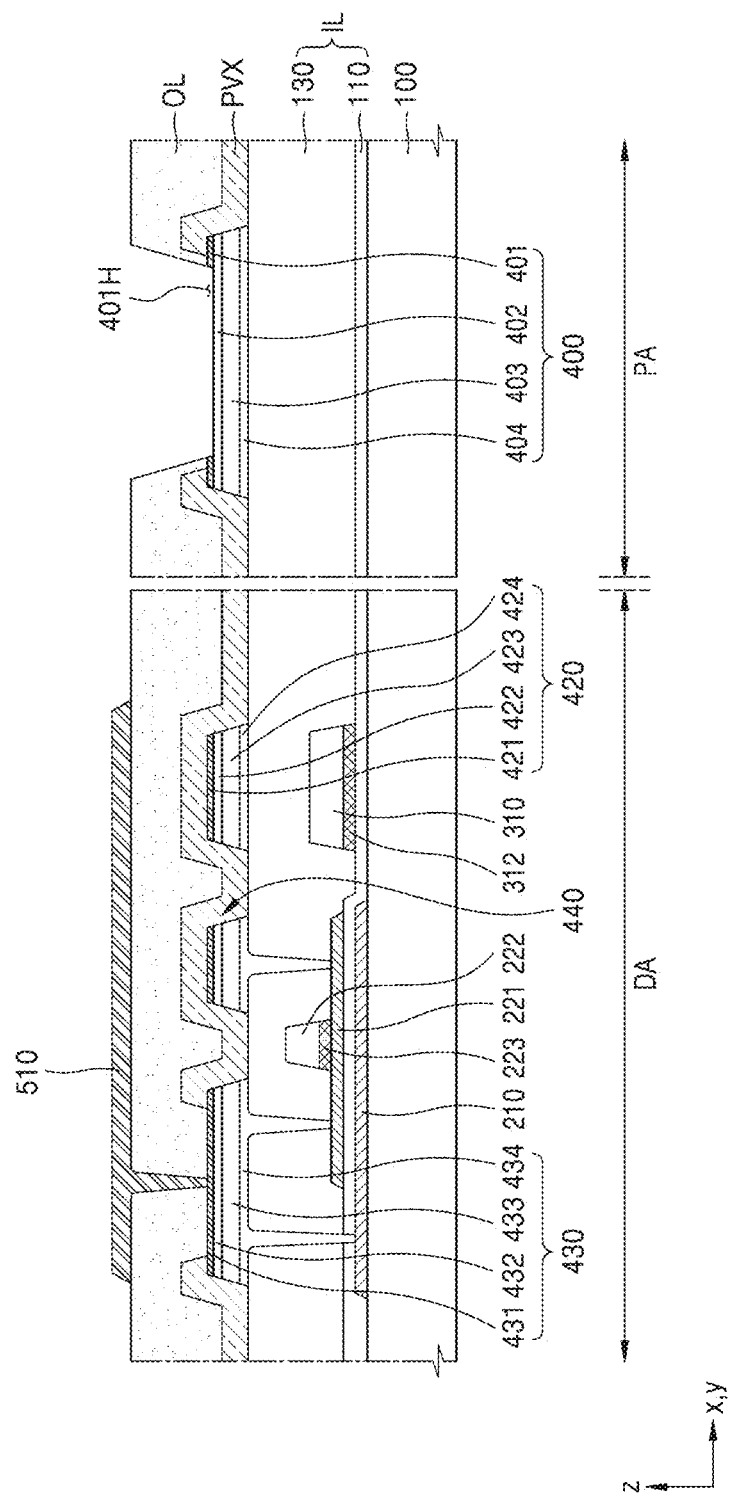
Figure 7F:
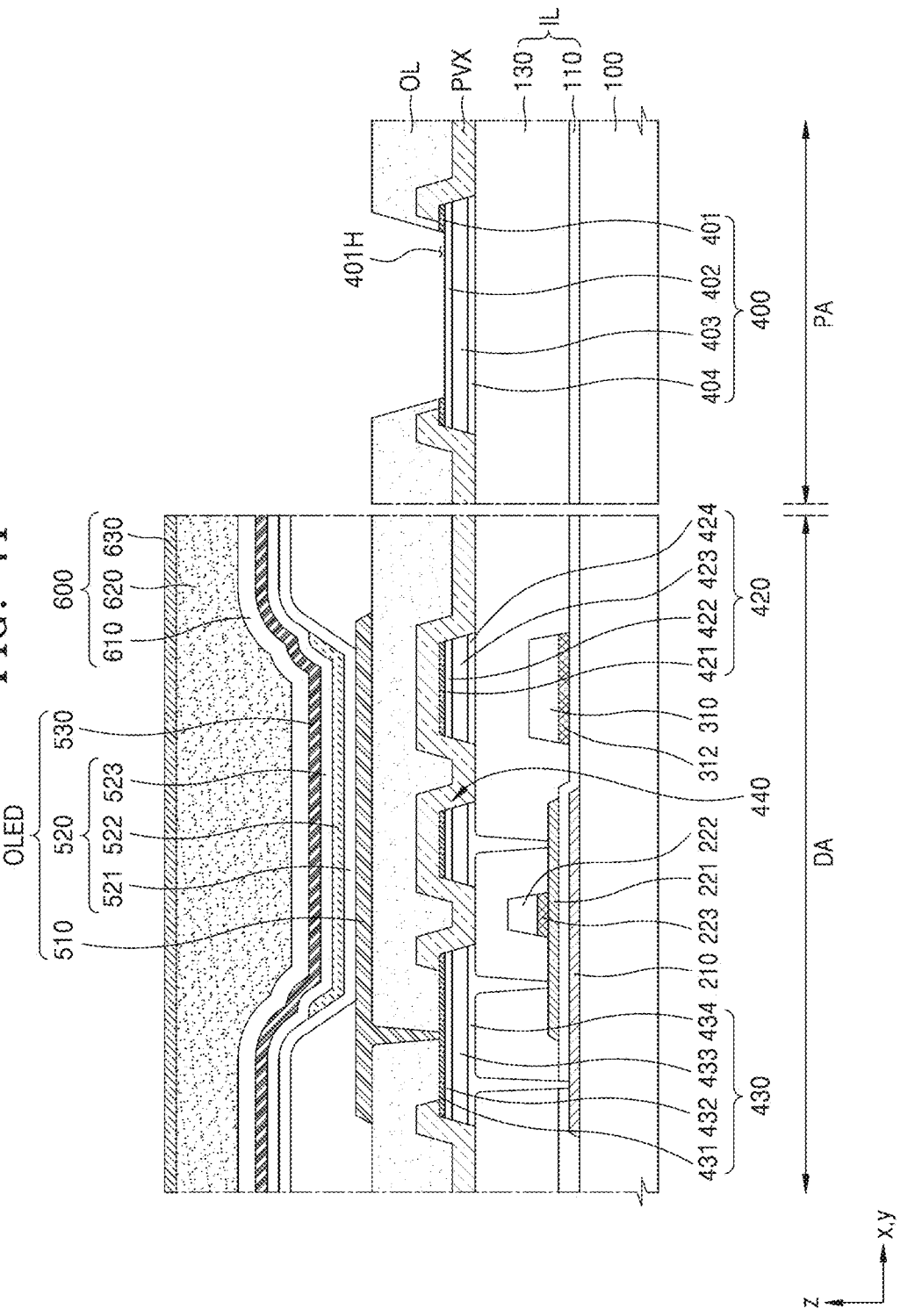
Figure 7G:
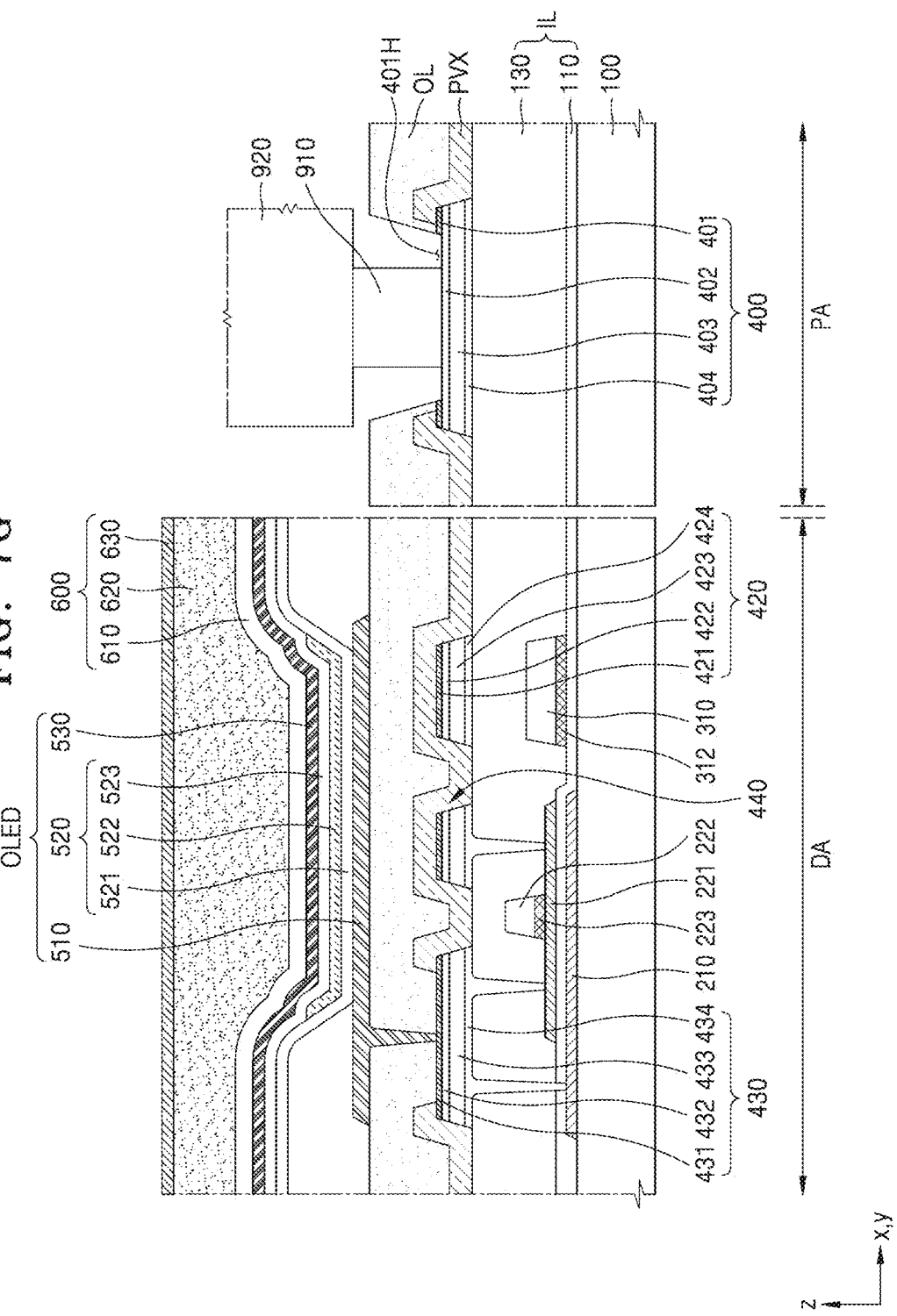

FIGS. 7A to 7F are cross-sectional views of a process of manufacturing a display device according to an embodiment, FIG. 7G is a cross-sectional view of a display device in which an electronic element is electrically connected on a pad after a process of FIG. 7F, and FIGS. 8A to 8C are cross-sectional views of a process of etching a stacked metal layer 1400.

Referring to FIG. 7A, a conductive layer 210 is provide or formed in the display area DA of the substrate 100. The conductive layer 210 may be provided under a thin film transistor of a pixel circuit to overlap the thin film transistor. The conductive layer 210 may include at least one of Al, Pt, Pd, Ag, Mg, Au, Ni, Nd, Ir, Cr, Li, Ca, Mo, or Cu. The substrate 100 may include a glass material or a polymer resin. The conductive layer 210 may receive a same voltage as a first power voltage, an initialization voltage, or a voltage applied to a transistor, e.g., a gate electrode, a source electrode or a drain electrode thereof, which will be described below.

A buffer layer 110 is provided or formed on the conductive layer 210. The buffer layer 110 is formed in, for example, the display area DA and the peripheral area PA to entirely cover the substrate 100. The buffer layer 110 may include an inorganic insulating material such as silicon oxide, silicon nitride, and/or silicon oxynitride and may have a single layer structure or a multi-layer structure.

A semiconductor layer 221 is provided or formed on the buffer layer 110. The semiconductor layer 221 may include a polycrystalline silicon. Alternatively, the semiconductor layer 221 may include a oxide semiconductor. Alternatively, the semiconductor layer 221 may include an amorphous silicon or an organic semiconductor. In an embodiment, the oxide semiconductor may include indium gallium zinc oxide ("IGZO"), zinc tin oxide ("ZTO"), and/or zinc indium oxide ("ZIO").

A gate electrode 222 is provided or formed over the semiconductor layer 221. The gate electrode 222 may include a low-resistance metal material. The gate electrode 222 may include a conductive material including Mo, Al, Cu, and Ti and may have a single layer structure or a multi-layer structure including the above materials.

A gate insulating layer 223 arranged between the semiconductor layer 221 and the gate electrode 222 may be simultaneously provided or formed with the gate electrode 222 during a same mask process as a mask process of forming the gate electrode 222. The gate insulating layer 223 and the gate electrode 222 formed during the same mask process may have substantially a same pattern, for example, a same planar shape.

A lower electrode 310 of a storage capacitor may be simultaneously provided or formed during a process of forming the gate electrode 222. The lower electrode 310 may include a same material as that of the gate electrode 222. A bottom insulating layer 312 may be provided or formed under the lower electrode 310, the bottom insulating layer 312 may include a same material as that of the gate insulating layer 223 and the bottom insulating layer 312 may include a same pattern as that of the lower electrode 310.

In an embodiment, as shown in FIG. 7A, the gate electrode 222 and the gate insulating layer 223 may simultaneously formed during the same mask process and the lower electrode 310 and the bottom insulating layer 312 are simultaneously formed during the same mask process, but embodiments are not limited thereto. In an alternative embodiment, the gate insulating layer 223 and the bottom insulating layer 312 may be formed as a single unitary body. In one embodiment, for example, the gate insulating layer 223 may be formed to entirely cover the substrate 100.

The gate insulating layer 223 may include an inorganic insulating material such as silicon oxide, silicon nitride, and silicon oxynitride. The gate insulating layer 223 may have a single layer structure or a multi-layer structure including the above materials.

An interlayer insulating layer 130 is provided or formed on the gate insulating layer 223 and the lower electrode 310. The interlayer insulating layer 130 may include an inorganic insulating material such as silicon oxide, silicon nitride, and silicon oxynitride. Alternatively, the interlayer insulating layer 130 may include an organic insulating material, for example, a general-purpose polymer, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination (e.g., a blend) thereof. Alternatively, the interlayer insulating layer 130 may include an inorganic insulating material and an organic insulating material.

After the interlayer insulating layer 130 is formed, contact holes may be formed by etching some portions of the interlayer insulating layer 130. In one embodiment, for example, as shown in FIG. 7A, a first contact hole Cnt1, a second contact hole Cnt2, and a third contact hole Cnt3 may be formed in a way such that the first contact hole Cnt1 and the second contact hole Cnt2 respectively expose a source region and a drain region of the semiconductor layer 221, and the third contact hole Cnt3 exposes the conductive layer 210. The first contact hole Cnt1 and the second contact hole Cnt2 may be formed to pass through the interlayer insulating layer 130. The third contact hole Cnt3 may be formed to pass through the interlayer insulating layer 130 and the buffer layer 110. The buffer layer 110 and the interlayer insulating layer 130 may correspond to the insulating layers IL described above with reference to FIGS. 3 to 6.

Referring to FIG. 7B, the stacked metal layer 1400 is provided or formed on the interlayer insulating layer 130. The stacked metal layer 1400 may be formed through, for example, a sputtering method. The stacked metal layer 1400 may include a metal thin film 1401, a conductive protective layer 1402, a metal layer 1403, and a bottom metal layer 1404 that are sequentially stacked in a down direction from top.

The metal thin film 1401 may include at least one of Al, Pt, Pd, Ag, Mg, Au, Ni, Nd, Ir, Cr, Li, Ca, Mo, or Cu. The metal thin film 1401 may have a thickness less than a thickness of at least one of the conductive protective layer 1402, the metal layer 1403, or the bottom metal layer 1404.

In one embodiment, for example, the metal thin film 1401 may have a thickness less than a thickness of each of the conductive protective layer 1402, the metal layer 1403, and the bottom metal layer 1404. The thickness of the metal thin film 1401 may be in a range of about several Å to about hundreds of Å, or in a range of about tens of Å to about hundreds of Å. In an embodiment, the metal thin film 1401 may have a thickness of 300 Å or less. In an embodiment, the metal thin film 1401 may be in a range of about 10 Å to about 300 Å, in a range of about 10 Å to about 200 Å, or a the range of about 10 Å to about 100 Å.

The conductive protective layer 1402 may include a TCO. The conductive protective layer 1402 may effectively prevent a damage of the metal layer 1403 arranged thereunder. A thickness of the conductive protective layer 1402 may be in a range of about 100 Å to about 400 Å, or in a range of about 200 Å to about 400 Å.

The metal layer 1403 may include at least one of Al, Pt, Pd, Ag, Mg, Au, Ni, Nd, Ir, Cr, Li, Ca, Mo, or Cu. The metal layer 1403 may include a material having excellent conductivity, for example, a conductive material including Cu, Mo, Al, and/or Ti. The metal layer 1403 may have a thickness greater than those of the other layers. A thickness of the metal layer 1403 may be several thousand Å or greater. In an embodiment, the thickness of the metal layer 1403 may be in a range of about 6000 Å to about 11000 Å.

The bottom metal layer 1404 may include at least one of Al, Pt, Pd, Ag, Mg, Au, Ni, Nd, Ir, Cr, Li, Ca, Mo, or Cu. In one embodiment, for example, the bottom metal layer 1404 may include Ti to have high conductivity and adhesive force.

After that, a photoresist PR, that is patterned, is provided or formed on the stacked metal layer 1400. The photoresist PR may include portions respectively arranged in the display area DA and the peripheral area PA. Respective portions of the photoresist PR may be formed through an exposure and a development.

The stacked metal layer 1400 is patterned by using the photoresist PR as a mask. The patterning of the stacked metal layer 1400 may be performed through an etching process, for example, a wet etching process. Sub-layers of the stacked metal layer 1400, for example, the conductive protective layer 1402, the metal layer 1403, and the bottom metal layer 1404 may be etched by a same etchant.

Through the process of etching the stacked metal layer 1400, the pad 400, an upper electrode 420 of the storage capacitor, a drain electrode 430, and a source electrode 440 may be formed on the substrate 100 as shown in FIG. 7C. A multi-layered structure of each of the pad 400, the upper electrode 420 of the storage capacitor, the drain electrode 430, and the source electrode 440 is formed while the sub-layers of the stacked metal layer 1400, for example, the metal thin film 1401, the conductive protective layer 1402, the metal layer 1403, and the bottom metal layer 1404 are simultaneously etched. Therefore, a multi-layered structure of each of the pad 400, the upper electrode 420 of the storage capacitor, the drain electrode 430, and the source electrode 440 includes a same number of sub-layers. Neighboring sub-layers may directly contact each other without a separate layer having an insulation property therebetween. Sub-layers 401, 402, 403, and 404 of the pad 400, sub-layers 421, 422, 423, and 424 of the upper electrode 420 of the storage capacitor, sub-layers 431, 432, 433, and 434 of the drain electrode 430, and sub-layers of the source electrode 440 may respectively include same materials as those of the metal thin film 1401, the conductive protective layer 1402, the metal layer 1403, and the bottom metal layer 1404.

Though the conductive protective layer 1402 of the stacked metal layer 1400 includes a material having a high etching selectivity difference with other sub-layer (e.g., neighboring sub-layers), the stacked metal layer 1400, for example, a transparent conductive oxide, each of the pad 400, the upper electrode 420 of the storage capacitor, the drain electrode 430 and the source electrode 440 formed through the etching of the stacked metal layer 1400, includes a lateral surface having a forward-tapered inclination surface as shown in FIG. 7C. In one embodiment, for example, each of the pad 400, the upper electrode 420 of the storage capacitor, the drain electrode 430, and the source electrode 440 may have an approximately trapezoidal cross-sectional shape. In one embodiment, for example, a width of each of sub-layers of the pad 400 may gradually increase in a direction from a top surface of the pad 400 to a bottom surface of the pad 400. A width of the conductive protective layer 402 may be greater than a width of the metal thin film 401, a width of the metal layer 403 may be greater than the width of the conductive protective layer 402, and a width of the bottom metal layer 404 may be greater than the width of the metal layer 403. Herein, a width of each layer may be defined as a width when viewed from a top plan view or a sectional view in a thickness direction of the stacked metal layer 1400 (or Z-axis direction). In this case, the width of each layer may be a width of a bottom surface thereof, which is greater than an upper surface thereof. In such an embodiment, widths of sub-layers of each of the upper electrode 420 of the storage capacitor, the drain electrode 430, and the source electrode 440 may gradually increase in a lower direction.

Figure 8A:
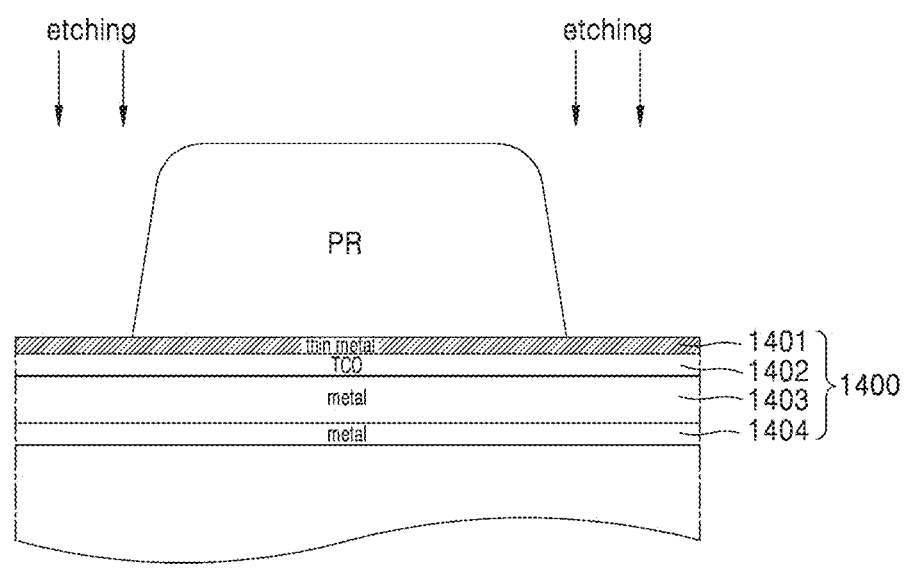
FIGS. 8A to 8C are cross-sectional views of a process of etching a stacked metal layer.
Figure 8B:
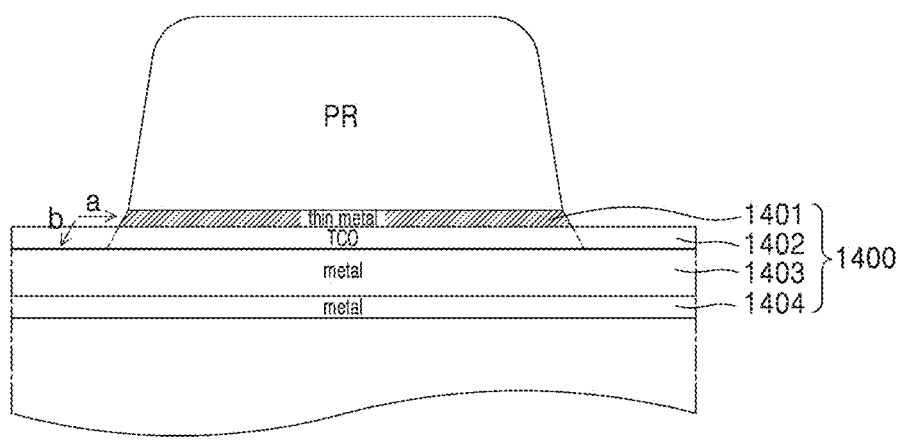
Figure 8C:
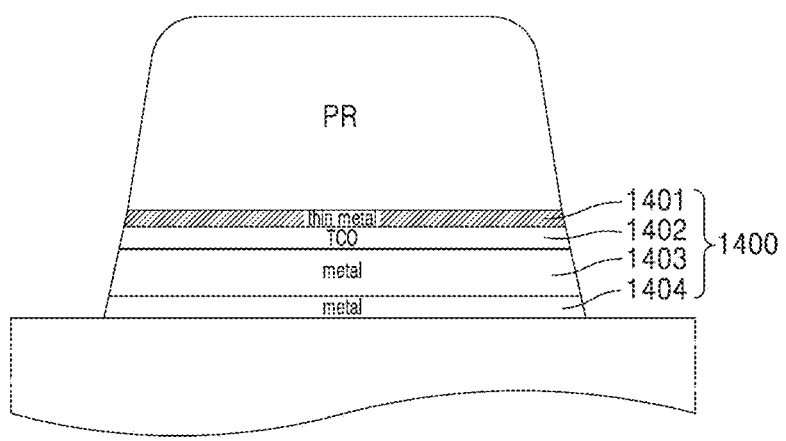

The process of etching the stacked metal layer 1400 will hereinafter be described in detail with reference to FIGS. 8A to 8C. As shown in FIG. 8A, after a photoresist PR is provided or formed on the stacked metal layer 1400, etching, for example, an etching process that uses etchant is performed. The etching process may be performed toward a lower portion of the stacked metal layer 1400 from an upper portion of the stacked metal layer 1400. After a portion of the metal thin film 1401 is etched, the conductive protective layer 1402 may be also etched. In a case where the metal thin film 1401 is arranged on the conductive protective layer 1402, it was found experimentally that an etching speed of the conductive protective layer 1402 is faster than a case where there is no metal thin film 1401 on the conductive protective layer 1402. Such a phenomenon may occur because etching is simultaneously performed in an a-direction and a b-direction while the metal thin film 1401 arranged on the conductive protective layer 1402 is continuously exposed to etchant and the etching in the a-direction influences the etching in the b-direction.

The etching process using etchant is also performed on the metal layer 1403 and the bottom metal layer 1404 arranged under the conductive protective layer 1402. The pad 400, on which the etching is completed, may have a forward-tapered lateral surface as shown in FIG. 8C.

Figure 10:
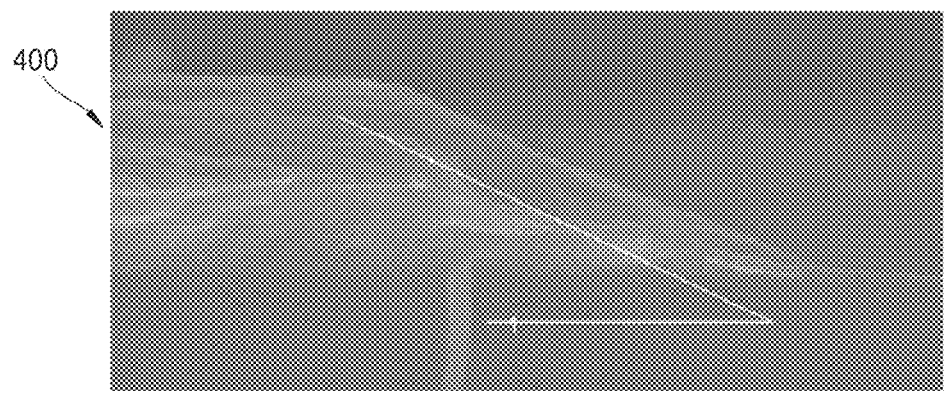
FIGS. 10 and 11 are views of a scanning electron microscope ("SEM") image of a pad according to embodiments.
Figure 11:
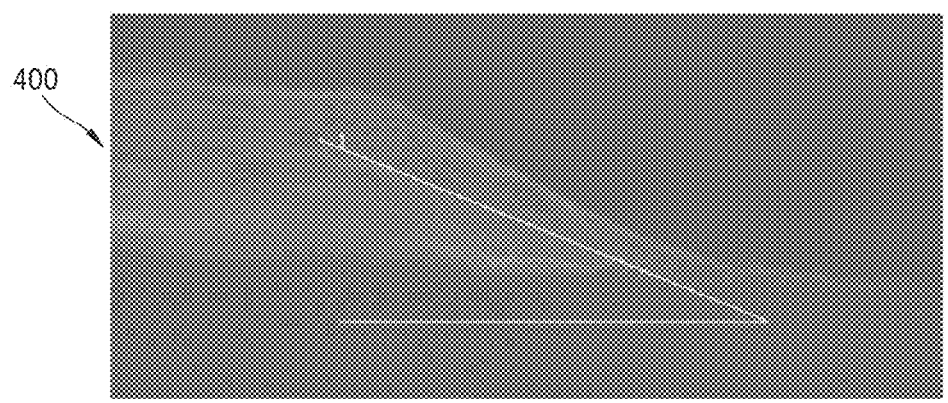

FIGS. 10 and 11 are views of a scanning electron microscope ("SEM") image of the pad 400 according to some embodiments, for example, Embodiment 1 and Embodiment 2. As shown in FIGS. 10 and 11, a lateral surface of the pad 400 may include a forward-tapered inclination surface. Specifications of sub-layers of the pad 400 according to Embodiment 1 and Embodiment 2 are listed in Table 1 below.

TABLE 1

| | Metal thin film Material (thickness) | Conductive protective layer Material (thickness) | Metal layer Material (thickness) | Bottom metal layer Material (thickness) |
| --- | --- | --- | --- | --- |
| Embodiment 1 | Cu (20 Å) | ITO (300 Å) | Cu (6000 Å) | Ti (200 Å) |
| Embodiment 2 | Cu (50 Å) | ITO (300 Å) | Cu (6000 Å) | Ti (200 Å) |

Figure 12:
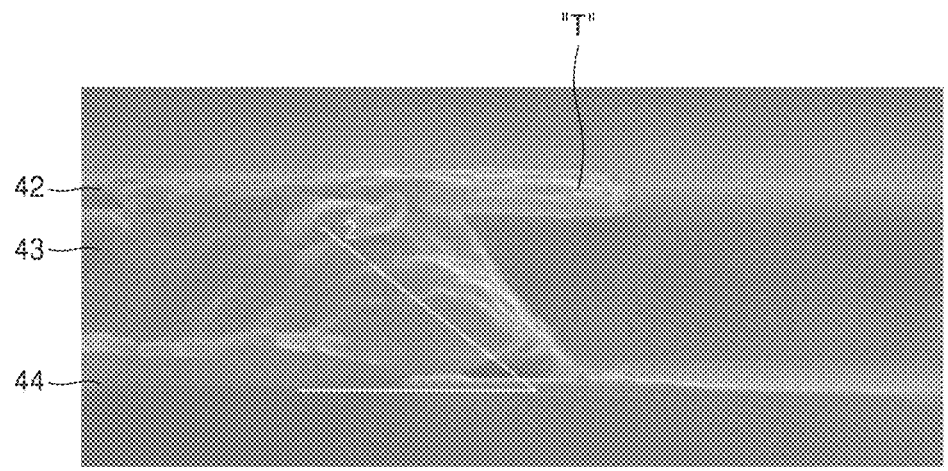
FIG. 12 is a view of an SEM image of a pad according to a comparative example.

In contrast, as a comparative example, in a case where the pad is formed by etching a stacked metal layer that does not include a metal thin film, a tip T is formed in a conductive protective layer 42 due to an etching selectivity difference between the conductive protective layer 42 that includes a TCO and other sub-layers (e.g. a metal layer 43 and a bottom metal layer 44) as shown in FIG. 12, in which the tip T protrudes further in a width direction than lateral surfaces of the metal layer 43 and the bottom metal layer 44. FIG. 12 is a view of an SEM image of a pad according to a comparative example. Specifications of sub-layers of the pad according to the comparative example are listed in Table 2 below.

TABLE 2

| | Metal thin film Material (thickness) | Conductive protective layer Material (thickness) | Metal layer Material (thickness) | Bottom metal layer Material (thickness) |
| --- | --- | --- | --- | --- |
| Comparative example | Not available | ITO (300 Å) | Cu (6000 Å) | Ti (200 Å) |

A tapered angle of a lateral surface of the pad 400 described above with reference to FIGS. 7D, 10 and 11 may have an acute angle, for example, about 70° or less, about 60° or less, or about 50° or less. Similarly, the upper electrode 420 of the storage capacitor, the drain electrode 430, and the source electrode 440 shown in FIG. 7D may also have a forward-tapered lateral surface.

Referring to FIG. 7E, after the pad 400, the upper electrode 420 of the storage capacitor, the drain electrode 430, and the source electrode 440 are provided or formed, the inorganic insulating layer PVX and the organic insulating layer OL may be provided or formed. The inorganic insulating layer PVX may have a single layer structure or a multi-layer structure including an inorganic insulating material such as silicon oxide, silicon nitride and silicon oxynitride. The organic insulating layer OL may include an organic insulating material such as PI.

The first hole PVX-H is formed in the inorganic insulating layer PVX to expose a central portion of the pad 400. A process of forming the first hole PVX-H may be performed before the organic insulating layer OL is formed. Since the first hole PVX-H overlaps the central portion of the pad 400, edges of the pad 400 may be covered by the inorganic insulating layer PVX. As described above, since the pad 400 includes the forward-tapered lateral surface, the inorganic insulating layer PVX may have a relatively constant thickness. As a comparative example, in a case where the pad 400 has a structure shown in FIG. 12, for example, in a case where the conductive protective layer 42 included in the pad 400 has the tip T, a defect of the step coverage of the inorganic insulating layer PVX may be caused due to the tip T.

The second hole OL-H may be formed through the organic insulating layer OL may also include to overlap the central portion of the pad 400. In an embodiment, as shown in FIG. 7E, a size of the second hole OL-H may be less than a size of the first hole PVX-H, but not being limited thereto. Alternatively, the size of the second hole OL-H may be substantially the same as the size of the first hole PVX-H. Alternatively, the size of the second hole OL-H may be greater than the size of the first hole PVX-H.

A pixel electrode 510 is provided or formed on the organic insulating layer OL, the pixel electrode 510 being located in the display area DA. The pixel electrode 510 may include TCO such as ITO, IZO, ZnO, $In_2O_3$, and/or AZO. In an alternative embodiment, the pixel electrode 510 may include a reflective layer including Ag, Mg, Al, Pt, Pd, Au, Ni, Nd, Ir, Cr, or a combination (e.g., a compound or alloy) thereof. In another alternative embodiment, the pixel electrode 510 may further include a layer including ITO, IZO, ZnO, or $In_2O_3$, on/under the reflective layer. In one embodiment, for example, the pixel electrode 510 may have a three-layered structure in which an ITO layer, an Ag layer, and an ITO layer are stacked.

Figure 9A:
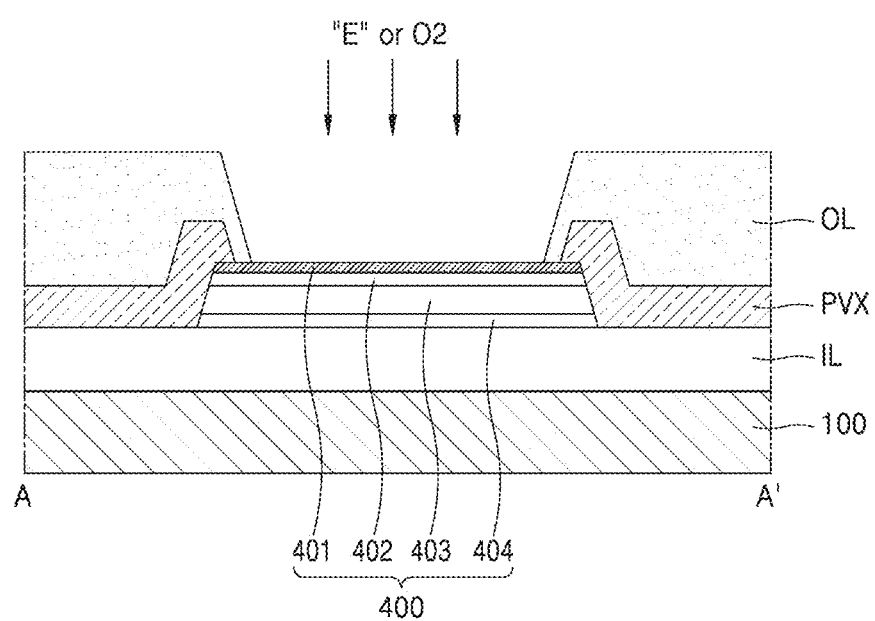
FIGS. 9A and 9B are cross-sectional views showing that a third hole is formed in a metal thin film of a pad.
Figure 9B:
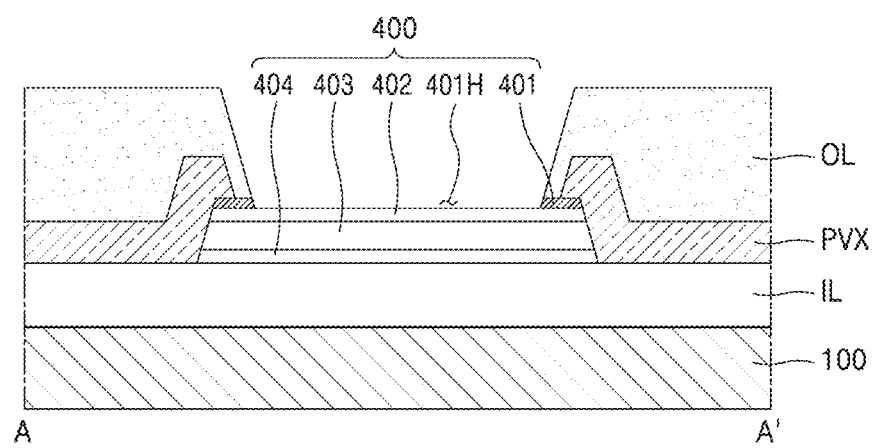

The pixel electrode 510 may be provided or formed by forming a material layer constituting the pixel electrode 510 and then etching the material layer. The pixel electrode 510 may be formed by, for example, wet etching. Unlike the drain electrode 430, the source electrode 440 and the upper electrode 420 of the storage capacitor, the pad 400 is exposed through the first hole PVX-H and the second hole OL-H. Therefore, a portion of the pad 400 exposed through the first hole PVX-H and the second hole OL-H may be removed through a process of etching the pixel electrode 510. In such an embodiment, as shown in FIG. 7E, the third hole 401H is formed while the metal thin film 401 among the sub-layers of the pad 400 is removed. FIGS. 9A and 9B are cross-sectional views showing that the third hole 401H is formed in the metal thin film 401 of the pad 400.

During a process of manufacturing the display device, the pad 400 is exposed through the first hole PVX-H and the second hole OL-H as shown in FIG. 9A. An exposed portion of the metal thin film 401 may be removed by etchant E used during the process of etching the pixel electrode 510 as described above, or removed through an ashing process that uses oxygen ($O_2$), where the ashing process may be performed separately from the etching of the pixel electrode 510. Therefore, the metal thin film 401 may include the third hole 401H overlapping the first hole PVX-H and the second hole OL-H, as shown in FIG. 9B.

The third hole 401H may pass through from a top surface of the metal thin film 401 to a bottom surface of the metal thin film 401 but does not pass through the conductive protective layer 402 under the metal thin film 401. A width of the third hole 401H may be substantially the same as a width of a hole having a small width, for example, the second hole OL-H among the first hole PVX-H and the second hole OL-H.

In an embodiment, as shown in FIG. 7E, the third hole 401H may be formed through the metal thin film 401 of the pad 400. In FIG. 7E, the drain electrode 430 and the source electrode 440 of the thin film transistor, and/or the upper electrode 420 of the storage capacitor are covered by an insulating layer, for example, the organic insulating layer OL before an etching or ashing process, and thus no hole is formed through uppermost sub-layers of multi-layers constituting the drain electrode 430, the source electrode 440 and/or the upper electrode 420 of the storage capacitor, unlike the metal thin film 401 of the pad 400. The uppermost sub-layers of the drain electrode 430, the source electrode 440, and/or the upper electrode 420 of the storage capacitor including a same material as that of the metal thin film 401 may entirely cover a top surface of sub-layers thereunder.

Referring to FIG. 7F, after the pixel electrode 510 is formed, a pixel-defining layer 150 in which an opening is formed to overlap the pixel electrode 510, is provided or formed. The pixel-defining layer 150 with the opening may expose a top surface of the pixel electrode 510 and may cover edges of the pixel electrode 510. The pixel-defining layer 150 may include an organic insulating material. Alternatively, the pixel-defining layer 150 may include an inorganic insulating material. Alternatively, the pixel-defining layer 150 may include an organic insulating material and an inorganic insulating material.

An intermediate layer 520 is provided or formed on the pixel-defining layer 150. The intermediate layer 520 includes an emission layer 522. The intermediate layer 520 may include a first functional layer 521 under the emission layer 522 and/or a second functional layer 523 on the emission layer 522. The intermediate layer 520 may be formed through an evaporation process, for example, thermal deposition.

The first functional layer 521 may have a single layer structure or a multi-layer structure. In one embodiment, for example, where the first functional layer 521 includes a polymer material, the first functional layer 521 may be a hole transport layer ("HTL"), which has a single-layered structure. The first functional layer 521 may include poly-(3,4)-ethylene-dihydroxy thiophene ("PEDOT") or polyaniline ("PANI"). In an embodiment where the first functional layer 521 includes a low molecular weight material, the first functional layer 521 may include a hole injection layer ("HIL") and a hole transport layer (HTL).

The emission layer 522 may include a polymer or low molecular weight organic material for emitting light of a predetermined color.

The second functional layer 523 is provided optionally. In one embodiment, for example, where the first functional layer 521 and the emission layer 522 include a polymer material, it is desired to provide the second functional layer 523. The second functional layer 523 may have a single layer structure or a multi-layer structure. The second functional layer 523 may include an electron transport layer ("ETL") and/or an electron injection layer ("EIL").

The emission layer 522 of the intermediate layer 520 may be provided or disposed for each pixel. Each of the first functional layer 521 and the second functional layer 523 of the intermediate layer 520 may be formed as a single unitary body to cover a plurality of pixels.

An opposite electrode 530 may include a conductive material having a low work function. In one embodiment, for example, the opposite electrode 530 may include a (semi) transparent layer including Ag, Mg, Al, Pt, Pd, Au, Ni, Nd, Ir, Cr, Li, Ca, or a combination (e.g., an alloy) thereof. Alternatively, the opposite electrode 530 may further include a layer including ITO, IZO, ZnO, or $In_2O_3$ on the (semi) transparent layer including the above material.

An organic light-emitting diode OLED having a multi-layered structure is covered by an encapsulation layer 600, the multi-layered structure including the pixel electrode 510, the intermediate layer 520, and the opposite electrode 530.

The encapsulation layer 600 may include at least one inorganic encapsulation layer and at least one organic encapsulation layer. In an embodiment, the encapsulation layer 600 may include a first inorganic encapsulation layer 610, an organic encapsulation layer 620, and a second inorganic encapsulation layer 630 that are sequentially stacked.

The first and second inorganic encapsulation layers 610 and 630 may include at least one inorganic insulating material. The inorganic insulating material may include aluminum oxide, tantalum oxide, hafnium oxide, zinc oxide, silicon oxide, silicon nitride, and/or silicon oxynitride. The organic encapsulation layer 620 may include a polymer-based material. The polymer-based material may include an acrylic-based resin, an epoxy-based resin, polyimide, and/or polyethylene. The acrylic-based resin may include, for example, polymethylmethacrylate, poly acrylic acid.

Referring to FIG. 7G, an electronic structure 920 may be electrically connected to the pad 400 via a conductive material layer 910. The electronic structure 920 may include a data driver that may provide a data signal to each pixel. In an embodiment, the electronic structure 920 may include the above-described data driver, wirings for providing a first power voltage and/or a second power voltage, and a circuit structure that may provide various control signals to pixels. The electronic structure 920 may have an integrated circuit ("IC") form or a flexible printed circuit board ("FPCB") form.

The conductive material layer 910 may include a bump included in the electronic structure 920. In one embodiment, for example, a bump provided to a lower end of the electronic structure 920 may directly contact the pad 400, and thus the electronic structure 920 may be electrically connected to the pad 400. Alternatively, the conductive material layer 910 may include a conductive adhesive layer such as an anisotropic conductive film. In such an embodiment, the bump of the electronic structure 920 may contact a conductive ball included in the conductive material layer 910, which is an anisotropic conductive film, and the conductive ball may contact the pad 400, such that the electronic structure 920 may be electrically connected to the pad 400.

Figure 13:
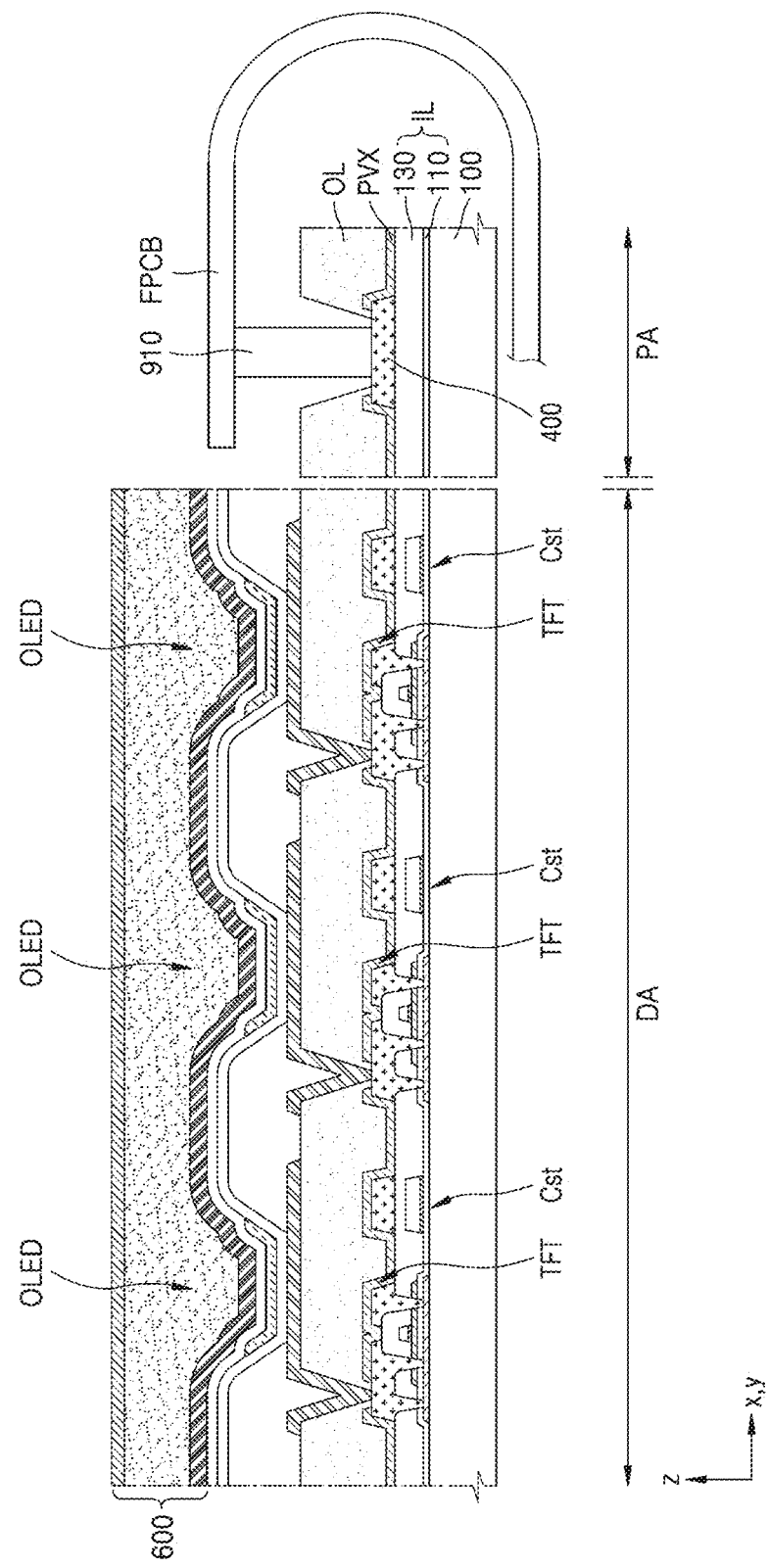
FIGS. 13 and 14 are cross-sectional views of a display device according to an embodiment.
Figure 14:
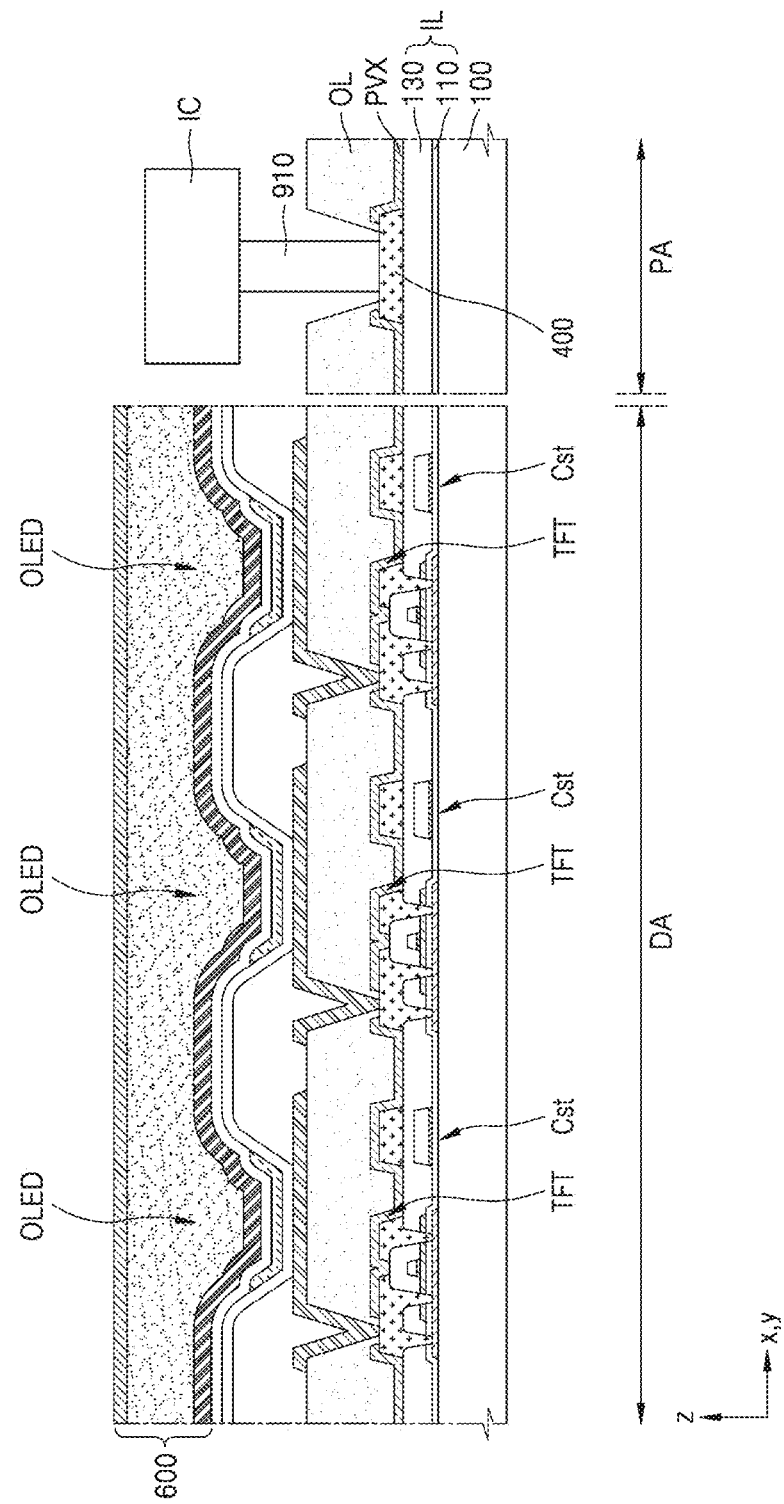

FIGS. 13 and 14 are cross-sectional views of a display device according to an embodiment, and a structure of the peripheral area PA of the display device is the same as that described above.

In an embodiment, as shown in FIG. 13, a FPCB is electrically connected to the pad 400 through the conductive material layer 910 including the anisotropic conductive film. The FPCB may include the data driver, the wirings, and the pixel structure. In an alternative embodiment, as shown in FIG. 14, an IC having a chip form and including the data driver is electrically connected to the pad 400 through the conductive material layer 910. In such an embodiment, the conductive material layer 910 may include a bump of the IC corresponding to a portion of the IC, or an anisotropic conductive film including a conductive ball. The IC may include not only the above-described data driver but also wirings for applying power voltages, and circuit structures.

A portion of the FPCB of FIG. 13 may be arranged on a front surface of the substrate 100 and connected to the pad 400, and the rest of the FPCB may be bent toward a bottom surface of the substrate 100. The IC shown in FIG. 14 is compact compared to the FPCB and may be located on only the front surface of the substrate 100.

Figure 15:
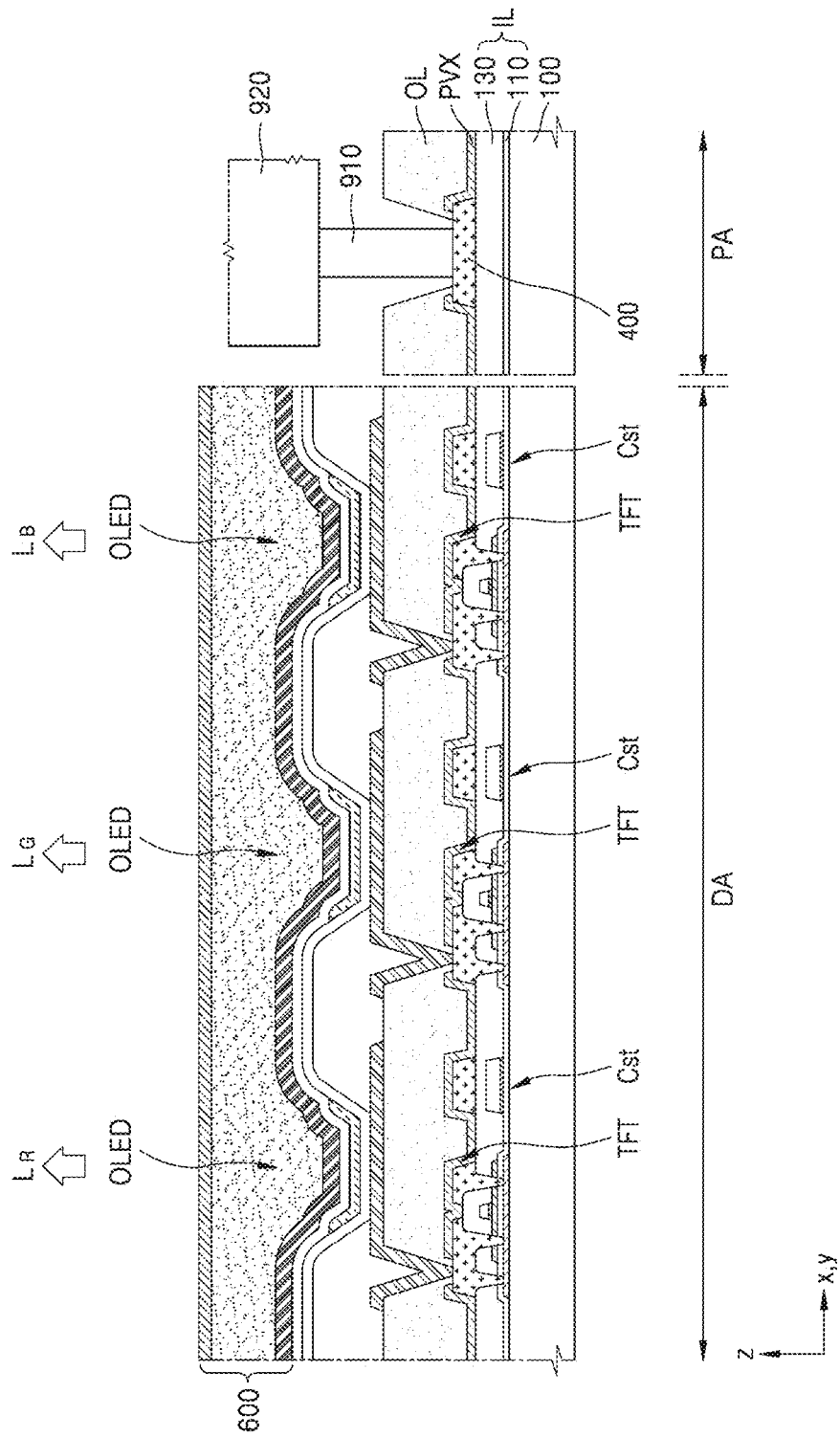
FIGS. 15 and 16 are cross-sectional views of a display device according to an embodiment.
Figure 16:
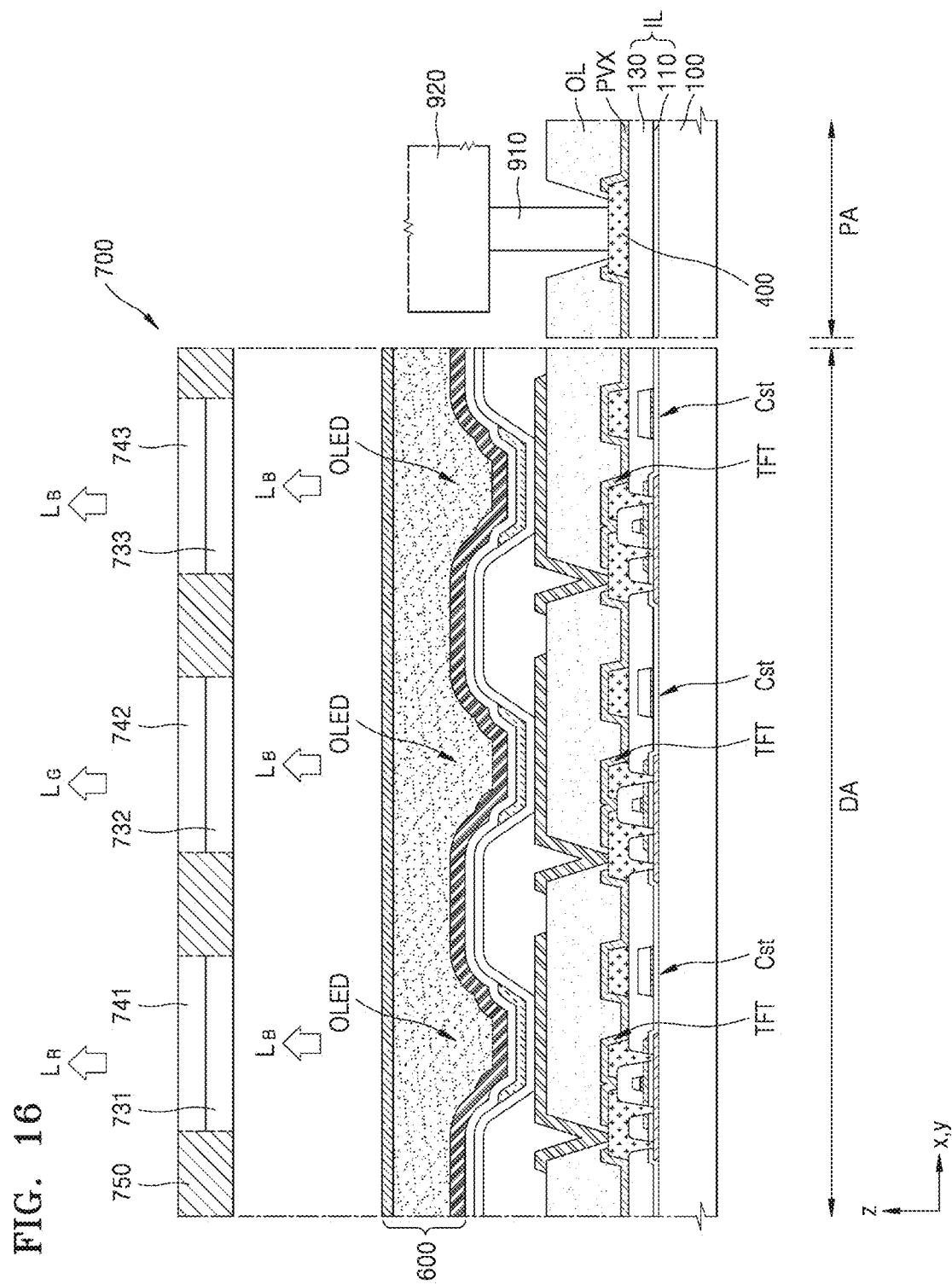

FIGS. 15 and 16 are cross-sectional views of a display device according to an embodiment.

In an embodiment, organic light-emitting diodes OLED arranged in the display area DA of the display device may emit lights of different colors. In an embodiment, as shown in FIG. 15, a display device includes an organic light-emitting diode OLED that emits red light $L_R$, an organic light-emitting diode OLED that emits green light $L_G$, and an organic light-emitting diode OLED that emits blue light $L_B$.

In an alternative embodiment, as shown in FIG. 16, the organic light-emitting diodes OLED of the display device may emit blue light $L_B$. Some of blue lights $L_B$ emitted from the organic light-emitting diodes OLED provided to respective pixels may be converted to red light $L_R$ or green light $L_G$ through a color conversion optical layer 700.

The color conversion optical layer 700 includes a first color converter 731 that converts blue light $L_B$ into red light $L_R$. Light converted by the first color converter 731 has improved color purity while passing through a red color filter 741 and may be emitted to the outside. The first color converter 731 may include a quantum dot and a scattering particle. A quantum dot may have a core-shell structure including a core and a shell, the core including a nano crystal, and the shell surrounding the core. A core of a quantum dot may include one of a Group II-Group VI compound, a Group III-V compound, a Group IV-VI compound, a Group IV element, a Group IV compound, and/or a combination thereof. A scattering particle may include $TiO_2$.

The color conversion optical layer 700 includes a second color converter 732 that converts blue light $L_B$ into green light $L_G$. Blue light $L_B$ emitted from an organic light-emitting diode OLED is converted by the second color converter 732, and the converted light has improved color purity while passing through a green color filter 742 and may be emitted to the outside. The second color converter 732 may include a quantum dot and a scattering particle. A quantum dot may have a core-shell structure including a core and a shell, the core including a nano crystal, and the shell surrounding the core. A core of a quantum dot may include one of a Group II-Group VI compound, a Group III-V compound, a Group IV-VI compound, a Group IV element, a Group IV compound, and a combination thereof. A size and/or a structure of a quantum dot of the second color converter 732 may be different from a size and/or a structure of a quantum dot of the first color converter 731.

Blue light $L_B$ emitted from an organic light-emitting diode OLED may have improved color purity while passing through a transmissive portion 733 and a blue color filter 743 and may be emitted to the outside. The transmissive portion 733 includes a scattering particle such as $TiO_2$ and may improve light efficiency.

In an embodiment, a light-blocking portion 750 is disposed between neighboring two portions among the first color converter 731, the second color converter 732, and the transmissive portion 733, and/or between neighboring two portions among the red color filter 741, the green color filter 742, and the blue color filter 743. The light-blocking portion 750 may include a black matrix.

Figure 17:
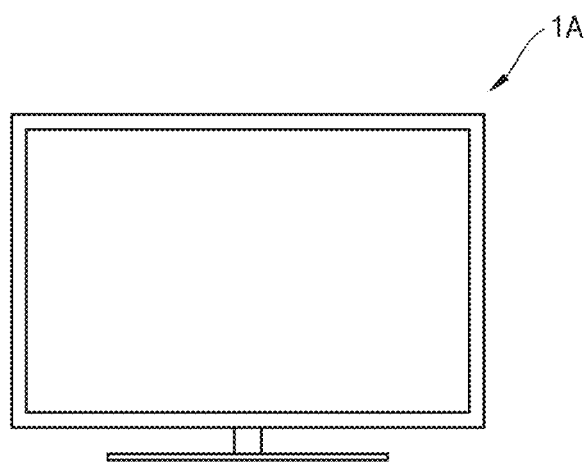
FIGS. 17 to 19 are views of an electronic apparatus to which a display device according to an embodiment is applied.
Figure 18:
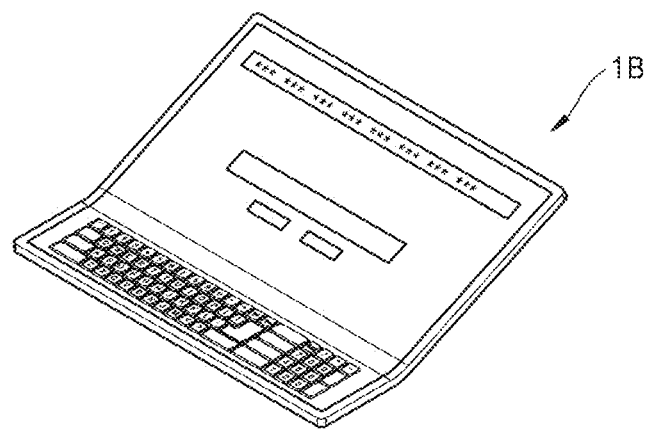
Figure 19:
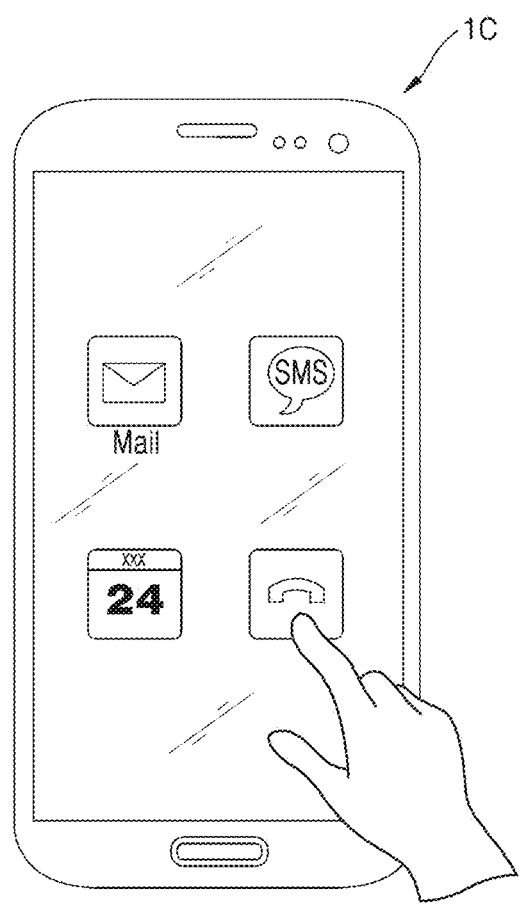

FIGS. 17 to 19 are views of an electronic apparatus to which a display device according to an embodiment is applied.

The display device including the above structure may be a television 1A as shown in FIG. 17, may be a laptop computer or a foldable tablet personal computer ("PC") 1B as shown in FIG. 18, and may be a portable display device 10 such as a mobile phone as shown in FIG. 19. Alternatively, the display device is applicable to a display unit provided to an artificial intelligence speaker. Herein, embodiments of the display device set forth herein may be included in an electronic apparatus that may display a predetermined image.

In embodiments of a display device, the number of manufacturing processes of a pad and manufacturing time may be minimized, and a display device including high-quality pads may be provided.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a display area and a peripheral area outside the display area;
a plurality of display elements arranged in the display area;
a pad disposed in the peripheral area and having a multi-layered structure,
wherein the multi-layered structure of the pad comprises:
a metal layer;
a conductive protective layer on a top surface of the metal layer; and
a metal thin film on a top surface of the conductive protective layer; and
at least one insulating layer covering an edge of the multi-layered structure of the pad, wherein a hole is defined through the at least one insulating layer to overlap the multi-layered structure of the pad,
wherein the plurality of display elements is above the at least one insulating layer and the multi-layered structure of the pad is below the at least one insulating layer.

2. The display device of claim 1, wherein
the conductive protective layer comprises a transparent conductive oxide.

3. The display device of claim 1, wherein
a lateral surface of the multi-layered structure has a forward-tapered inclination.

4. The display device of claim 1, wherein
Each of the metal layer and the metal thin film comprises at least one of Al, Pt, Pd, Ag, Mg, Au, Ni, Nd, Ir, Cr, Li, Ca, Mo, or Cu.

5. The display device of claim 1, wherein
a thickness of the metal layer is greater than a thickness of the conductive protective layer, and
the thickness of the metal layer is greater than a thickness of the metal thin film.

6. The display device of claim 1, wherein
a thickness of the metal thin film is about 300 Å or less.

7. The display device of claim 1, wherein
the at least one insulating layer comprises:
an inorganic insulating layer, through which a first hole is defined to overlap the multi-layered structure of the pad; and
an organic insulating layer, through which a second hole is defined to overlap the multi-layered structure of the pad and the first hole.

8. The display device of claim 7, wherein
a third hole is defined through the metal thin film of the multi-layered structure to overlap the hole of the at least one insulating layer.

9. The display device of claim 8, wherein
the metal thin film comprises:
a metal sub-layer including a first metal element; and
a metal oxide sub-layer on a top surface of the metal sub-layer and including an oxide of the first metal element of the metal sub-layer.

10. The display device of claim 1, wherein
the multi-layered structure of the pad further comprises:
a bottom metal layer on a bottom surface of the metal layer.

11. A display device comprising:
a substrate including a display area and a peripheral area outside the display area;
a plurality of display elements arranged in the display area;
a pad disposed in the peripheral area and having a multi-layered structure,
wherein the multi-layered structure of the pad comprises:
a metal layer;
a conductive protective layer on a top surface of the metal layer; and
a metal thin film on a top surface of the conductive protective layer, and
wherein the metal thin film comprises:
a metal sub-layer including a metal element; and
a metal oxide sub-layer on the metal sub-layer and including an oxide of the metal element of the metal sub-layer.

12. A display device comprising:
a substrate including a display area and a peripheral area outside the display area;
a display element in the display area;
a pixel circuit comprising a thin film transistor and a storage capacitor, wherein the thin film transistor and the storage capacitor are electrically connected to the display element;
a pad in the peripheral area and having a forward-tapered lateral surface,
wherein the pad has a multi-layered structure, and
the multi-layered structure of the pad comprises:
a conductive layer comprising a transparent conductive oxide; and
a metal thin film on a top surface of the conductive layer; and
at least one insulating layer covering an edge of the pad, wherein the display element is above the at least one insulating layer and the multi-layered structure of the pad is below the at least one insulating layer.

13. The display device of claim 12, wherein
the metal thin film comprises at least one of Al, Pt, Pd, Ag, Mg, Au, Ni, Nd, Ir, Cr, Li, Ca, Mo, or Cu.

14. The display device of claim 12, wherein
the metal thin film comprises:
a metal sub-layer including a metal element; and
a metal oxide sub-layer on a top surface of the metal sub-layer and including an oxide of the metal element of the metal sub-layer.

15. The display device of claim 12,
wherein a hole is defined through the at least one insulating layer to overlap the multi-layered structure of the pad.

16. The display device of claim 15, wherein
a hole is defined through the metal thin film of the multi-layered structure to correspond to the hole of the at least one insulating layer.

17. The display device of claim 12, wherein
at least one of an electrode of the thin film transistor or an electrode of the storage capacitor comprises a same number of sub-layers as the multi-layered structure of the pad.

18. The display device of claim 12, wherein
the multi-layered structure of the pad comprises
a metal layer on a bottom surface of the conductive layer and having a thickness equal to or greater than about ½ a thickness of the pad.

19. The display device of claim 18, further comprising:
a bottom conductive layer on a bottom surface of the conductive layer,
wherein the metal layer comprises at least one of Al, Pt, Pd, Ag, Mg, Au, Ni, Nd, Ir, Cr, Li, Ca, Mo, or Cu, and
the bottom conductive layer comprises a metal element different from a metal element of the metal layer.

\* \* \* \* \*